(12) United States Patent
Cho et al.

(10) Patent No.: US 11,955,408 B2
(45) Date of Patent: Apr. 9, 2024

(54) INTEGRATED CIRCUIT SEMICONDUCTOR DEVICE INCLUDING THROUGH SILICON VIA

(71) Applicant: SAMSUNG ELECTRONICS CO., LTD., Suwon-si (KR)

(72) Inventors: Sohye Cho, Hwaseong-si (KR); Pilkyu Kang, Hwaseong-si (KR); Kwangjin Moon, Hwaseong-si (KR); Taeseong Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 734 days.

(21) Appl. No.: 17/036,145

(22) Filed: Sep. 29, 2020

(65) Prior Publication Data
US 2021/0305130 A1      Sep. 30, 2021

(30) Foreign Application Priority Data
Mar. 26, 2020   (KR) .................. 10-2020-0037059

(51) Int. Cl.
| | | |
|---|---|---|
| H01L 23/48 | (2006.01) | |
| H01L 21/768 | (2006.01) | |
| H01L 23/50 | (2006.01) | |
| H01L 23/528 | (2006.01) | |
| H10B 10/00 | (2023.01) | |

(52) U.S. Cl.
CPC ...... *H01L 23/481* (2013.01); *H01L 21/76898* (2013.01); *H01L 23/5286* (2013.01); *H10B 10/12* (2023.02); *H01L 23/50* (2013.01)

(58) Field of Classification Search
None
See application file for complete search history.

(56) References Cited

U.S. PATENT DOCUMENTS

| | | | |
|---|---|---|---|
| 7,947,553 | B2 | 5/2011 | Kim |
| 8,338,289 | B2 | 12/2012 | Murayama et al. |
| 8,853,857 | B2 | 10/2014 | Farooq et al. |
| 9,257,392 | B2 | 2/2016 | Yang et al. |
| 9,646,930 | B2 | 5/2017 | Tezcan et al. |
| 9,773,831 | B1 | 9/2017 | Yang et al. |
| 9,847,255 | B2 | 12/2017 | Lin et al. |
| 10,056,315 | B2 | 8/2018 | Akou et al. |
| 10,483,125 | B2 | 11/2019 | Inoue et al. |
| 10,490,677 | B2 | 11/2019 | Mizuta et al. |
| 2010/0102454 | A1 | 4/2010 | Akiyama |
| 2014/0061940 | A1 | 3/2014 | Kitao et al. |

(Continued)

*Primary Examiner* — Phat X Cao
*Assistant Examiner* — Diana C Vieira
(74) *Attorney, Agent, or Firm* — Fish & Richardson P.C.

(57) ABSTRACT

An integrated circuit semiconductor device includes a substrate including a first surface and a second surface opposite the first surface, a trench in the substrate, the trench extending from the first surface of the substrate toward the second surface of the substrate, a through silicon via (TSV) landing part in the trench, the TSV landing part having a first portion spaced apart from the first surface of the substrate, and a second portion between the first portion and the first surface of the substrate, the first portion being wider than the second portion, a TSV hole in the substrate, the TSV hole extending from the second surface of the substrate and aligned with a bottom surface of the TSV landing part, and a TSV in the TSV hole and in contact with the bottom surface of the TSV landing part.

20 Claims, 34 Drawing Sheets

(56) References Cited

U.S. PATENT DOCUMENTS

2018/0145030 A1   5/2018  Beyne et al.
2019/0019743 A1   1/2019  Fang et al.
2019/0088545 A1   3/2019  Okuda
2019/0164882 A1*  5/2019  Chen .................... H01L 23/535
2019/0311973 A1*  10/2019  Ingerly ............. H01L 21/76898

* cited by examiner

INTEGRATED CIRCUIT SEMICONDUCTOR DEVICE INCLUDING THROUGH SILICON VIA

CROSS-REFERENCE TO RELATED APPLICATION

Korean Patent Application No. 10-2020-0037059, filed on Mar. 26, 2020, in the Korean Intellectual Property Office, and entitled: "Integrated Circuit Semiconductor Device Including Through Silicon Via," is incorporated by reference herein in its entirety.

BACKGROUND

1. Field

Embodiments relate to an integrated circuit semiconductor device, and more particularly, to an integrated circuit semiconductor device including a through silicon via (TSV).

2. Description of the Related Art

In integrated circuit semiconductor devices, TSVs are formed to pass through a substrate and electrically connect wirings (or terminals). As integrated circuit semiconductor devices are highly integrated, a size of each TSV may be reduced.

SUMMARY

According to an aspect of embodiments, there is provided an integrated circuit semiconductor device including a substrate including a first surface and a second surface opposite the first surface, a trench in the substrate, the trench extending from the first surface of the substrate toward the second surface of the substrate, a through silicon via (TSV) landing part in the trench, the TSV landing part having a first portion spaced apart from the first surface of the substrate, and a second portion between the first portion and the first surface of the substrate, the first portion being wider than the second portion, a TSV hole in the substrate, the TSV hole extending from the second surface of the substrate and aligned with a bottom surface of the TSV landing part, and a TSV in the TSV hole and in contact with the bottom surface of the TSV landing part.

According to another aspect of embodiments, there is provided an integrated circuit semiconductor device including a substrate including a first surface and a second surface opposite to the first surface, a plurality of active elements formed at the first surface of the substrate, a plurality of through silicon via (TSV) landing parts connected to the plurality of active elements and buried into a trench formed in the substrate, each of the plurality of TSV landing parts being configured so that a lower portion thereof is wider in width than an upper portion thereof, and a plurality of TSVs connected to the plurality of TSV landing parts and buried into a plurality of TSV holes aligned with bottom surfaces of the plurality of TSV landing parts, wherein some of the plurality of TSV landing parts are connected to a power rail part or a ground rail part.

According to another aspect of embodiments, there is provided an integrated circuit semiconductor device including a substrate including a first surface and a second surface opposite to the first surface, a plurality of active elements formed at the first surface of the substrate, the plurality of active elements including a plurality of finFET transistors which include a plurality of pins disposed on the first surface of the substrate to extend in a first direction, a plurality of gate electrodes extending in a second direction vertical to the first direction, and a plurality of source and drain regions disposed at both sides of the plurality of gate electrodes in the second direction, a plurality of through silicon via (TSV) landing parts connected to the source drain regions of the plurality of finFET transistors and buried into the substrate, each of the plurality of TSV landing parts being configured so that a portion thereof apart from the first surface is wider in width than a portion thereof adjacent to the first surface, and a plurality of TSVs connected to the plurality of TSV landing parts and buried into a plurality of TSV holes aligned with bottom surfaces of the plurality of TSV landing parts from the second surface, wherein some of the plurality of TSV landing parts are connected to a power rail part or a ground rail part disposed in the same direction as the first direction.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, embodiments will be described in detail with reference to the accompanying drawings.

Figure 1:
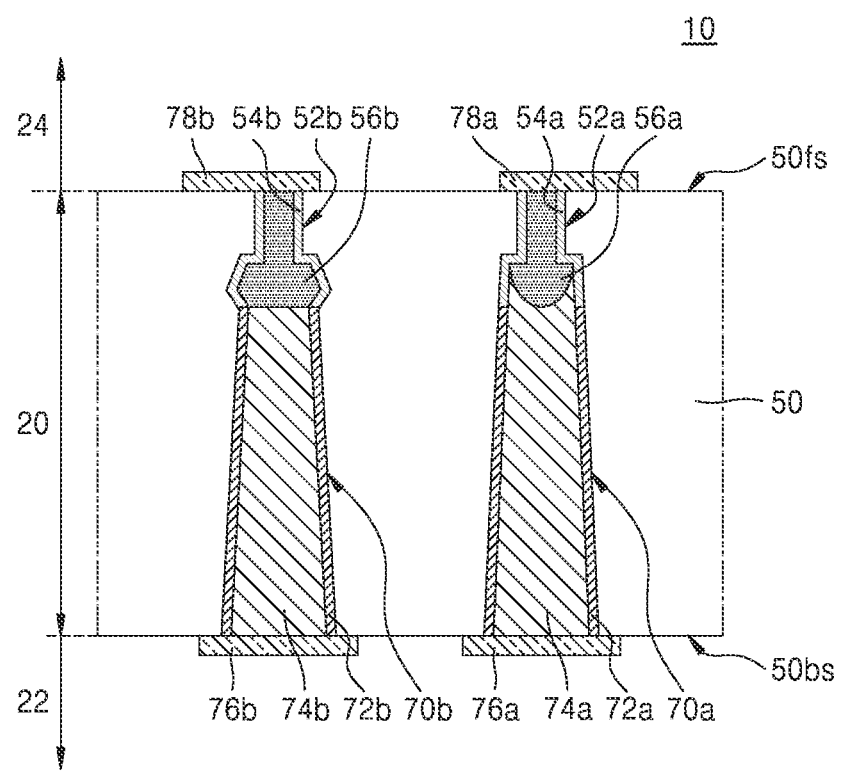
FIG. 1 is a cross-sectional view of an integrated circuit semiconductor device according to an embodiment.

FIG. 1 is a cross-sectional view of an integrated circuit semiconductor device 10 according to an embodiment.

Referring to FIG. 1, the integrated circuit semiconductor device 10 may include a substrate 50 which includes a first surface 50*fs* and a second surface 50*bs* opposite to the first surface 50*fs*. In some embodiments, the substrate 50 may include, e.g., a silicon substrate. The substrate 50 may be referred to as a silicon layer. The first surface 50*fs* may be a front surface of the substrate 50. The second surface 50*bs* may be a rear surface of the substrate 50. In some embodiments, the first surface 50*fs* may be the rear surface of the substrate 50, and the second surface 50*bs* may be the front surface of the substrate 50.

The integrated circuit semiconductor device 10 may include a plurality of through silicon via (TSV) landing parts 56*a* and 56*b* and a plurality of TSVs 74*a* and 74*b*. The TSV landing parts 56*a* and 56*b* and the TSVs 74*a* and 74*b* may be respectively referred to as a through via landing part and a through via. The TSV landing parts 56*a* and 56*b* may be buried into the substrate 50. The TSV landing parts 56*a* and 56*b* may be buried into a plurality of trenches 52*a* and 52*b*, respectively, which are formed to a certain depth from the first surface 50*fs* of the substrate 50.

The TSV landing parts 56*a* and 56*b* may include a first TSV landing part 56*a* and a second TSV landing part 56*b*, which are disposed apart from each other. In some embodiments, a shape of the first TSV landing part 56*a* may be the same as or different from that of the second TSV landing part 56*b*.

The TSV landing parts 56*a* and 56*b* may each include a conductive layer. Each of the first and second TSV landing parts 56*a* and 56*b* may include a metal layer, e.g., a tungsten layer, a titanium nitride layer, a cobalt layer, or a combination layer thereof. The first and second TSV landing parts 56*a* and 56*b* may each include an impurity-doped silicon layer.

Each of the first and second TSV landing parts 56*a* and 56*b* may be configured so that a portion thereof apart from the first surface 50*fs* in a direction toward the second surface 50*bs* is wider in width than a portion thereof adjacent to the first surface 50*fs*. For example, as illustrated in FIG. 1, a portion of each of the first and second TSV landing parts 56*a* and 56*b* that is vertically spaced apart from the first surface 50*fs* toward the second surface 50*bs* may have a larger width than that of a portion adjacent to the first surface 50*fs*. A plurality of trench liner layers 54*a* and 54*b* may be formed on inner walls of the trenches 52*a* and 52*b*, respectively. Each of the trench liner layers 54*a* and 54*b* may include an insulation layer, e.g., an oxide layer or a nitride layer.

The TSVs 74*a* and 74*b* may be buried into a plurality of TSV holes 70*a* and 70*b* extending from the second surface 50*bs* of the substrate 50, and the TSV holes 70*a* and 70*b* may be aligned with bottom surfaces of the first and second TSV landing parts 56*a* and 56*b*. The TSV holes 70*a* and 70*b* may include a first TSV hole 70*a* and a second TSV hole 70*b*, which are disposed apart from each other. The first and second TSV holes 70*a* and 70*b* may be aligned with and formed on the bottom surfaces of the first and second TSV landing parts 56*a* and 56*b*, and thus, the TSVs 74*a* and 74*b* may be easily buried into the TSV holes 70*a* and 70*b*.

Furthermore, each of the first and second TSV landing parts 56*a* and 56*b* may be configured so that a lower portion thereof, i.e., a portion farther from the first surface 50*fs*, is wider in width than an upper portion thereof, i.e., a portion closer to the first surface 50*fs*, and thus, the TSVs 74*a* and 74*b* may be easily formed. In other words, the TSVs 74*a* and 74*b* may be more easily landed at the first and second TSV landing parts 56*a* and 56*b* where the lower portion thereof, i.e., a portion contacting a respective one of the TSVs 74*a* and 74*b*, is wider in width than the upper portion thereof, i.e., a portion contacting the first surface 50*fs*. The TSVs 74*a* and 74*b* may, e.g., directly, contact bottom portions of the first and second TSV landing parts 56*a* and 56*b*, and thus, may be mechanically or electrically connected to the first and second TSV landing parts 56*a* and 56*b*.

In some embodiments, each of the TSVs 74*a* and 74*b* may be formed so that a width thereof is reduced in a direction from the second surface 50*bs* to the first surface 50*fs*, and thus, a side profile thereof is inclined. For example, as illustrated in FIG. 1, each of the TSVs 74*a* and 74*b* may have a gradually increasing width in a direction oriented from the first surface 50*sf* to the second surface 50*bs*, e.g., to have a trapezoidal cross-section. The TSVs 74*a* and 74*b* may include a first TSV 74*a* and a second TSV 74*b*, which are disposed apart from each other. The first TSV 74*a* and the second TSV 74*b* may be respectively buried into the first TSV hole 70*a* and the second TSV hole 70*b*. The first TSV 74*a* and the second TSV 74*b* may respectively contact the first TSV landing part 56*a* and the second TSV landing part 56*b*, and thus, may be mechanically and electrically connected to the first TSV landing part 56*a* and the second TSV landing part 56*b*.

Each of the first TSV 74*a* and the second TSV 74*b* may include a metal layer, e.g., a copper layer, a tungsten layer, a titanium nitride layer, a cobalt layer, or a combination layer thereof. A plurality of via hole liner layers 72*a* and 72*b* may be formed at inner sidewalls of the first and second TSV holes 70*a* and 70*b*. Each of the via hole liner layers 72*a* and 72*b* may include an insulation layer, e.g., an oxide layer or a nitride layer.

In some embodiments, a plurality of upper contact pads 78*a* and 78*b* may be formed on the first and second TSV landing parts 56*a* and 56*b*, respectively, on the first surface 50*fs*. In some embodiments, a plurality of lower contact pads 76*a* and 76*b* may be formed on the first and second TSVs 74*a* and 74*b*, respectively, on the second surface 50*bs* of the substrate 50.

The integrated circuit semiconductor device 10 may include the first and second TSV landing parts 56*a* and 56*b*, and thus, the first and second TSVs 74*a* and 74*b* may be reliably formed. Furthermore, in the integrated circuit semiconductor device 10, a width of each of portions at which the TSVs 74*a* and 74*b* land may be set to be greater than that of each of portions at which the TSVs 74*a* and 74*b* do not land, and thus, the TSVs 74*a* and 74*b* may be easily formed.

In some embodiments, elements such as the TSV landing parts 56*a* and 56*b* and the TSVs 74*a* and 74*b* may be formed in a front end of line (FEOL) or middle end of line (MEOL) manufacturing process 20. Elements on upper contact pads 78*a* and 78*b* on the first surface 50*fs* of the substrate 50 may be formed in a back end of line (BEOL) manufacturing process 24. Elements on the lower contact pads 76*a* and 76*b* on the second surface 50*bs* of the substrate 50 may be formed in a BEOL manufacturing process 22.

The integrated circuit semiconductor device 10 may be referred to as a semiconductor device, a semiconductor chip, or a semiconductor die. In FIG. 1, although the integrated circuit semiconductor device 10 is illustrated as a single device, a semiconductor stacked package may be formed by stacking other integrated circuit semiconductor devices on the integrated circuit semiconductor device 10 by using the upper contact pads 78*a* and 78*b* or the lower contact pads 76a and 76b. Therefore, the integrated circuit semiconductor device 10 may be used for a semiconductor stacked package according to an embodiment.

Figure 2A:
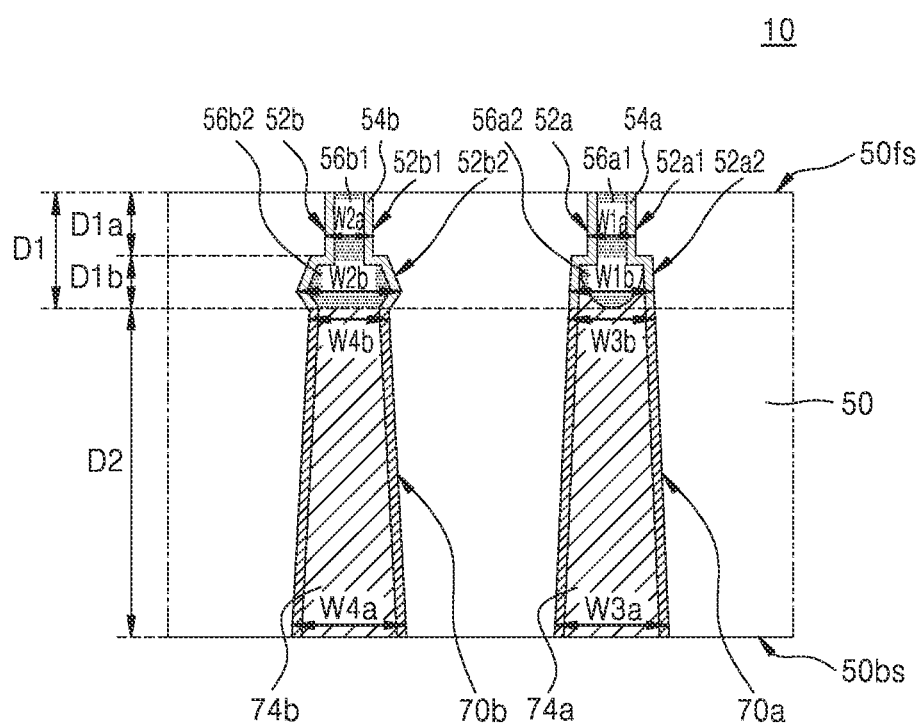
FIGS. 2A and 2B are detailed cross-sectional views of the integrated circuit semiconductor device of FIG. 1.
Figure 2B:
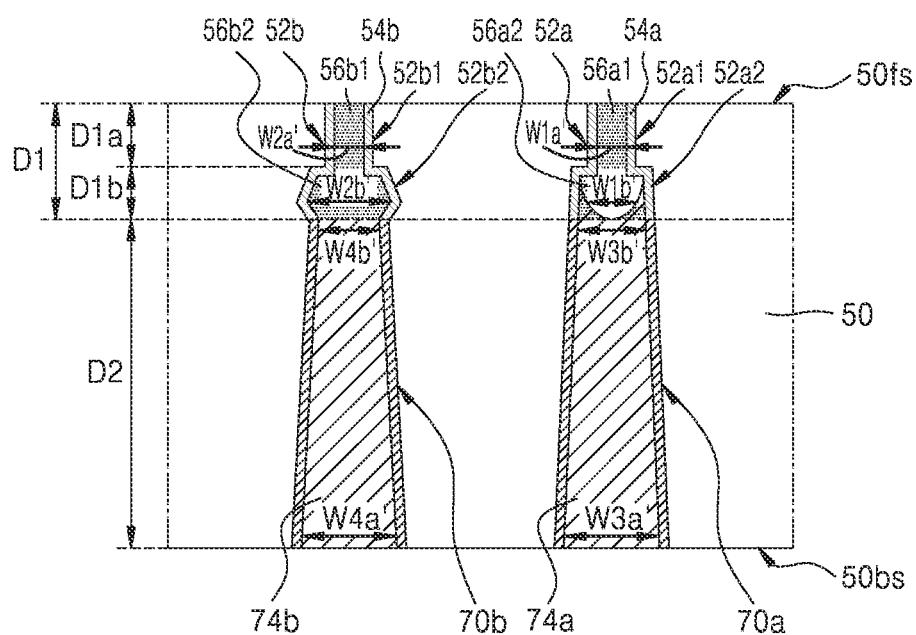

FIGS. 2A and 2B are detailed cross-sectional views provided for describing the integrated circuit semiconductor device 10 of FIG. 1.

In detail, a plurality of the TSV landing parts 56a and 56b of the integrated circuit semiconductor device 10 may be buried into a plurality of trenches 52a and 52b which are formed to a first depth D1 from the first surface 50fs. The trenches 52a and 52b may include a plurality of upper trenches 52a1 and 52b1, respectively, formed to a first sub-depth D1a from the first surface 50fs and a plurality of lower trenches 52a2 and 52b2, respectively, formed to a second sub-depth D1b from the upper trenches 52a1 and 52b1.

As illustrated in FIG. 2A, the upper trenches 52a1 and 52b1 may respectively have upper widths W1a and W2a. The lower trenches 52a2 and 52b2 may respectively have lower widths W1b and W2b. The lower widths W1b and W2b may be greater than the respective upper widths W1a and W2a. A shape of each of the upper trenches 52a1 and 52b1 or a shape of each of the lower trenches 52a2 and 52b2 will be described below in more detail.

A plurality of trench liner layers 54a and 54b may be formed on inner sidewalls of the upper trenches 52a1 and 52b1, respectively, and the lower trenches 52a2 and 52b2, respectively. A plurality of TSV landing parts 56a1, 56a2, 56b1, and 56b2 may be buried into a plurality of trench liner layers 54a and 54b in the upper trenches 52a1 and 52b1 and the lower trenches 52a2 and 52b2, respectively.

The TSV landing parts 56a1, 56a2, 56b1, and 56b2 may include a plurality of upper TSV landing parts 56a1 and 56b1 buried into the upper trenches 52a1 and 52b1, respectively, and a plurality of lower TSV landing parts 56a2 and 56b2 buried into the lower trenches 52a2 and 52b2, respectively, communicating with the upper trenches 52a1 and 52b1. For example, as illustrated in FIG. 2A, the upper trenches 52a1 and 52b1 may be in fluid communication with the respective lower trenches 52a2 and 52b2, e.g., so each pair of a lower trench and an upper trench forms a single uniform cavity, so the lower TSV landing parts 56a2 and 56b2 may be in direct contact with respective ones of the upper TSV landing parts 56a1 and 56b1 to be integral with each other.

A cross-sectional shape of each of the lower TSV landing parts 56a2 and 56b2 may be determined based on that of each of the respective trenches 52a2 and 52b2. For example, a cross-sectional shape of the lower TSV landing part 56a2 may be semicircular, and a cross-sectional shape of the lower TSV landing part 56b2 may be polygonal, e.g., hexagonal.

As illustrated in FIG. 2B, due to a thickness of each of the trench liner layers 54a and 54b, the upper TSV landing parts 56a1 and 56b1 may respectively have upper widths W1a' and W2a', which are less than the upper widths W1a and W2a of the upper trenches 52a1 and 52b1. The lower TSV landing parts 56a2 and 56b2 may respectively have lower widths W1b' and W2b', which are less than the lower widths W1b and W2b of the lower trenches 52a2 and 52b2. The lower widths W1b' and W2b' of the lower TSV landing parts 56a2 and 56b2 may be greater than the upper widths W1a' and W2a' of the upper TSV landing parts 56a1 and 56b1. The upper widths W1a' and W2a' may be relative concepts of the lower widths W1b' and W2b'. A width (for example, the lower width W1b') of at least a portion of the lower TSV landing part 56a2 may be greater than a width (for example, the upper width W1a') of at least a portion of the upper TSV landing part 56a1, and a width (for example, the lower width W2b') of at least a portion of the lower TSV landing part 56b2 may be greater than a width (for example, the upper width W2a') of at least a portion of the upper TSV landing part 56b1.

The TSVs 74a and 74b of the integrated circuit semiconductor device 10 may be buried into the TSV holes 70a and 70b having a second depth D2 from the second surface 50bs. The second depth D2 may be greater than the first depth D1. In some embodiments, as illustrated in FIG. 2A, widths W3a and W4a of portions, which are adjacent to the second surface 50bs, of the TSV holes 70a and 70b may be greater than widths W3b and W4b of portions, which are far from the second surface 50bs and are adjacent to the lower TSV landing parts 56a2 and 56b2, of the TSV holes 70a and 70b.

A plurality of via hole liner layers 72a and 72b may be formed on inner sidewalls of the TSV holes 70a and 70b. The TSVs 74a and 74b may be buried into the via hole liner layers 72a and 72b in the TSV holes 70a and 70b. As illustrated in FIG. 2B, due to a thickness of each of the via hole liner layers 72a and 72b, the TSVs 74a and 74b may respectively have widths W3a' and W4a', which are less than the widths W3a and W4a of the TSV holes 70a and 70b.

Portions, which are farther from the second surface 50bs and are adjacent to the lower TSV landing parts 56a2 and 56b2, of the TSVs 74a and 74b may respectively have widths W3b' and W4b'. Portions, which are adjacent to the second surface 50bs, of the TSVs 74a and 74b may have widths which are less than the widths W3a' and W4a'. Each of the TSVs 74a and 74b may be formed to have a width which is progressively reduced in a direction oriented from the second surface 50bs toward the first surface 50fs.

Figure 3A:
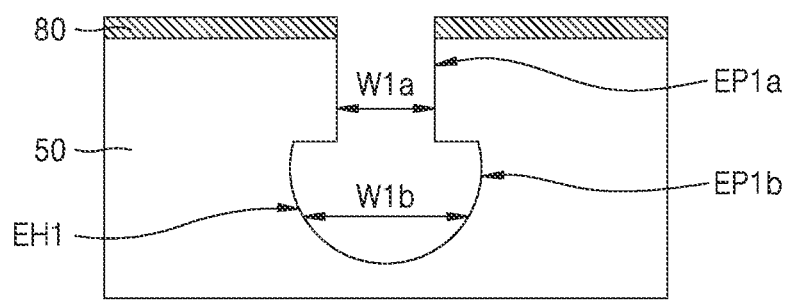
FIGS. 3A, 3B, 4A, 4B, and 5A-5C are cross-sectional views of a trench determining a through silicon via (TSV) landing part of an integrated circuit semiconductor device according to an embodiment.
Figure 3B:
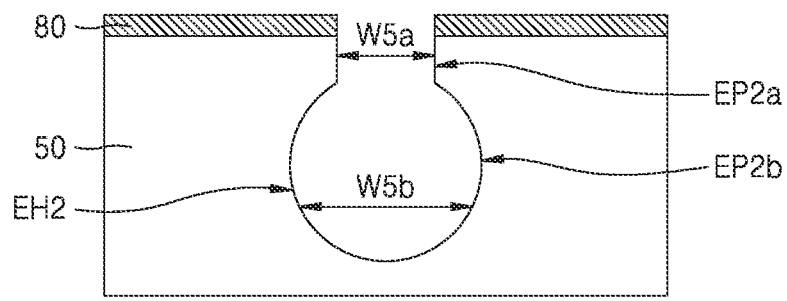
Figure 4A:
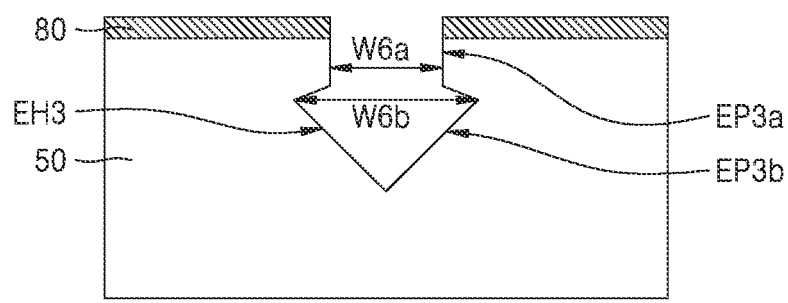
Figure 4B:
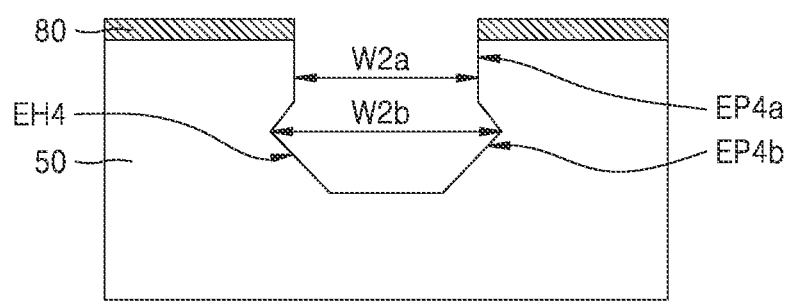
Figure 5A:
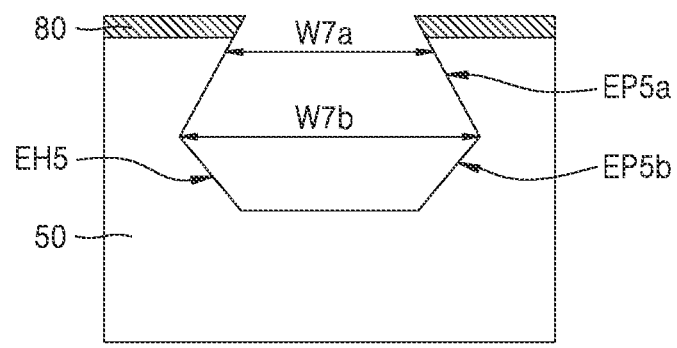
Figure 5B:
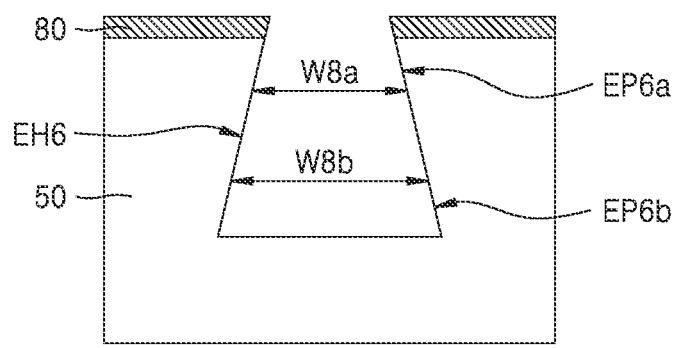
Figure 5C:
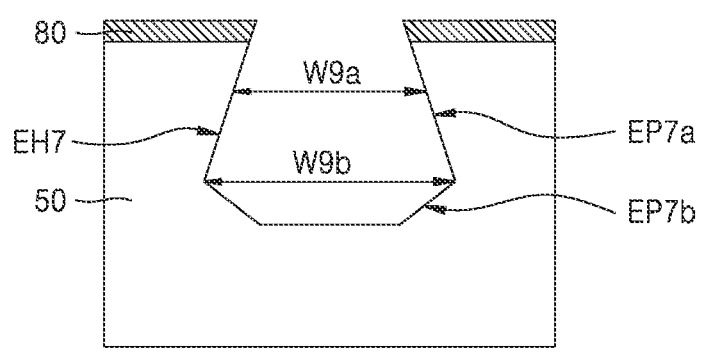

FIGS. 3 to 5 are cross-sectional views of a trench determining a TSV landing part of an integrated circuit semiconductor device according to an embodiment.

In detail, as described above, a plurality of TSV landing parts (56a and 56b of FIG. 1) may be buried in a plurality of trenches (52a and 52b of FIG. 1). A cross-sectional shape of each of the plurality of trenches (52a and 52b of FIG. 1) may be determined based on a cross-sectional shape of each of the plurality of TSV landing parts (56a and 56b of FIG. 1). In FIGS. 3 to 5, various embodiments applied to the plurality of trenches (52a and 52b of FIG. 1) will be described.

A plurality of trenches EH1 to EH7 illustrated in FIGS. 3 to 7 may be formed by etching (for example, dry-etching and/or wet-etching) a substrate 50 by using a mask layer 80. The trenches EH1 to EH7 may be formed by isotropic-etching and/or anisotropic-etching the substrate 50 by using a mask layer 80. In some embodiments, the trenches EH1 to EH7 may be formed by etching the substrate 50 several times (for example, primary and secondary) by using the mask layer 80.

In some embodiments, the trenches EH1 to EH7 may include a plurality of upper trenches EP1a to EP7a formed by primarily etching the substrate 50 and a plurality of lower trenches EP1b to EP7b formed by secondarily etching the substrate 50 further through, e.g., in communication with, the upper trenches EP1a to EP7a. A cross-sectional shape (or form) of each of the trenches EH1 to EH7 may be determined based on a crystallization direction of the substrate 50 and a shape and an etching slope of the mask layer 80.

In some embodiments, a cross-sectional shape of each of the trenches EH1 to EH7 may be, e.g., semicircular, circular, or polygonal. The trench EH1 illustrated in FIG. 3A may correspond to the trench 52a of FIG. 1. The trench EH4 illustrated in FIG. 4B may correspond to the trench 52b of FIG. 1.

The upper trenches EP1a to EP7a may respectively have upper widths W1a to W2a and W5a to W9a. The lower trenches EP1b to EP7b may respectively have lower widths W1b to W2b and W5b to W9b. The lower widths W1b to W2b and W5b to W9b of the lower trenches EP1b to EP7b may be greater than the upper widths W1a to W2a and W5a to W9a of the upper trenches EP1a to EP7a.

A width (for example, the lower widths W1b to W2b and W5b to W9b) of at least a portion of each of the lower trenches EP1b to EP7b may be greater than a width (for example, the upper widths W1a to W2a and W5a to W9a) of at least a portion of each of the upper trenches EP1a to EP7a.

FIGS. 6A to 6F are cross-sectional views of stages in a method of manufacturing the integrated circuit semiconductor device of FIG. 1.

Figure 6A:
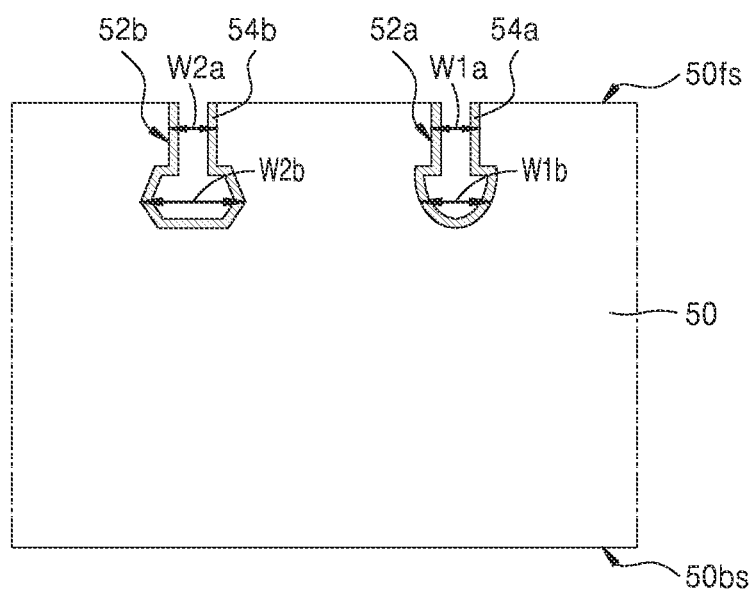
FIGS. 6A to 6F are cross-sectional views of stages in a method of manufacturing the integrated circuit semiconductor device of FIG. 1.

Referring to FIG. 6A, formation of the plurality of trenches 52a and 52b is illustrated. The substrate 50 including the first surface 50fs and the second surface 50bs opposite thereto may be prepared. The trenches 52a and 52b may be formed by etching the substrate 50 to a certain depth from the first surface 50fs. The trenches 52a and 52b may be formed by using a photolithography process. The trenches 52a and 52b may be formed by etching the substrate 50 by using a mask layer as an etch mask.

The trenches 52a and 52b may be formed in plurality, and the plurality of trenches 52a and 52b may be horizontally spaced apart from one another. A cross-sectional shape of the trench 52a may differ from that of the trench 52b. Lower widths W1b and W2b of the trenches 52a and 52b may be greater than upper widths W1a and W2a of the trenches 52a and 52b. A cross-sectional shape of each of the plurality of TSV landing parts (56a and 56b of FIG. 1) described below may be determined based on a cross-sectional shape of each of the trenches 52a and 52b. A plurality of trench liner layers 54a and 54b may be formed on inner sidewalls and bottoms of the trenches 52a and 52b. Each of the trench liner layers 54a and 54b may be formed as an insulation layer, e.g. may be formed as an oxide layer or a nitride layer.

Figure 6B:
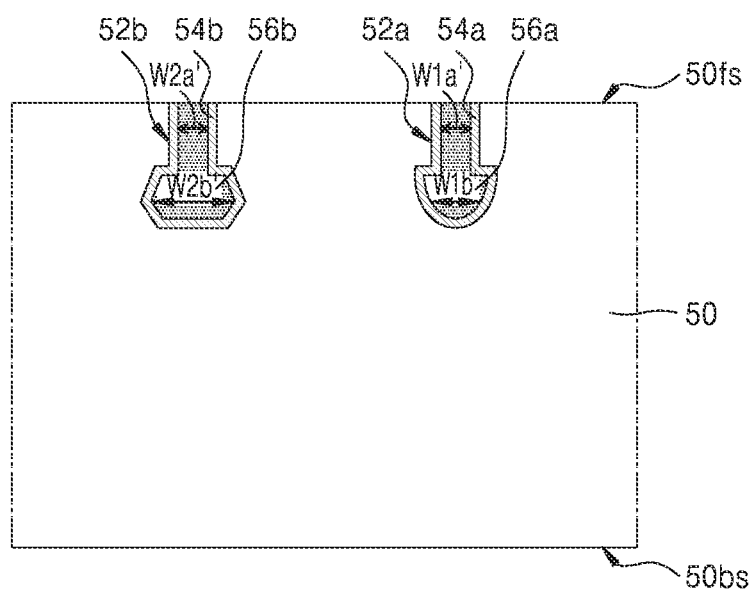

Referring to FIG. 6B, forming of the plurality of TSV landing parts 56a and 56b is illustrated. The TSV landing parts 56a and 56b may be formed by filling a conductive material into the trenches 52a and 52b with the trench liner layers 54a and 54b formed therein. Lower widths W1b' and W2b' of the TSV landing parts 56a and 56b may be greater than upper widths W1a' and W2a' of the TSV landing parts 56a and 56b.

Figure 6C:
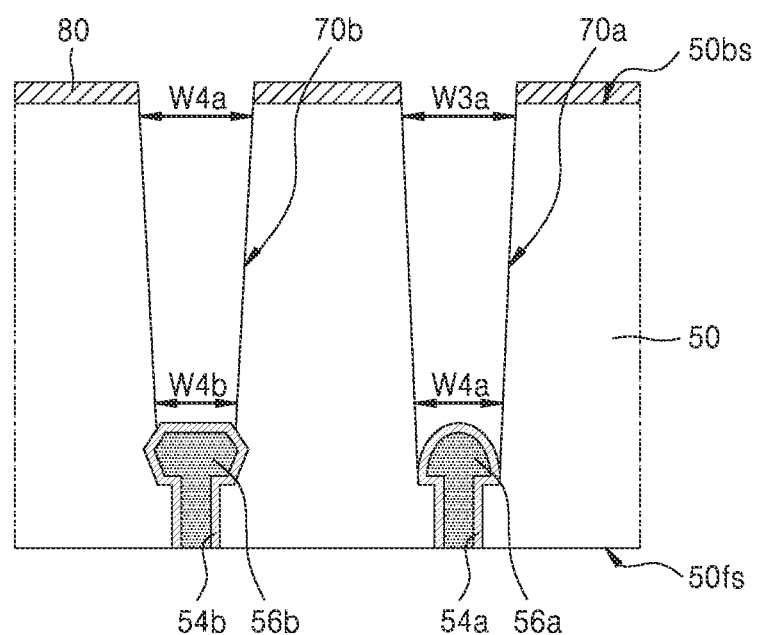

Referring to FIG. 6C, formation of the plurality of TSV holes 70a and 70b is illustrated. The substrate 50 may be turned over, and in this state, the mask layer 80 may be formed by using a photolithography process. Depending on the case, a preliminary substrate (or a carrier substrate) may be attached on the first surface 50fs of the substrate 50. The TSV holes 70a and 70b may be formed by etching the substrate 50 by using the mask layer 80 as an etch mask.

The TSV holes 70a and 70b may be aligned with and formed on the TSV landing parts 56a and 56b where a width of a bottom surface thereof is wider than that of a top surface thereof. For example, as illustrated in FIG. 6C, the openings of the mask layer 80 may be aligned with, e.g., overlap, the TSV landing parts 56a and 56b, so the TSV holes 70a and 70b may be formed through the substrate 50 until the TSV landing parts 56a and 56b are exposed. For example, since portions of the TSV landing parts 56a and 56b facing the TSV holes 70a and 70b are formed to be wide, alignment of the openings of the mask layer 80 with the TSV landing parts 56a and 56b, and therefore, alignment of the TSV holes 70a and 70b with the TSV landing parts 56a and 56b may be substantially facilitated. Therefore, the TSV holes 70a and 70b may be reliably formed. Widths W3a and W4a of portions, which are adjacent to the second surface 50bs, of the TSV holes 70a and 70b may be greater than widths W3b and W4b of portions, which are farther away from the second surface 50bs and are adjacent to a plurality of lower TSV landing parts 56a2 and 56b2, of the TSV holes 70a and 70b.

Figure 6D:
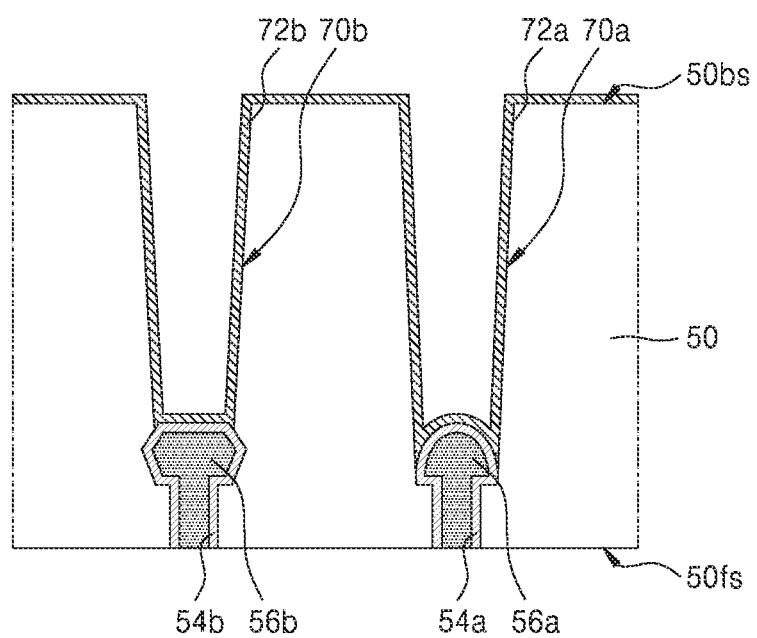

Referring to FIG. 6D, formation of the plurality of via hole liner layers 72a and 72b is illustrated. The mask layer 80 may be removed, and then, the via hole liner layers 72a and 72b may be, e.g., conformally, formed on inner sidewalls and bottoms of the TSV holes 70a and 70b and the substrate 50. Each of the via hole liner layers 72a and 72b may be formed as an insulation layer, e.g., as an oxide layer or a nitride layer.

Figure 6E:
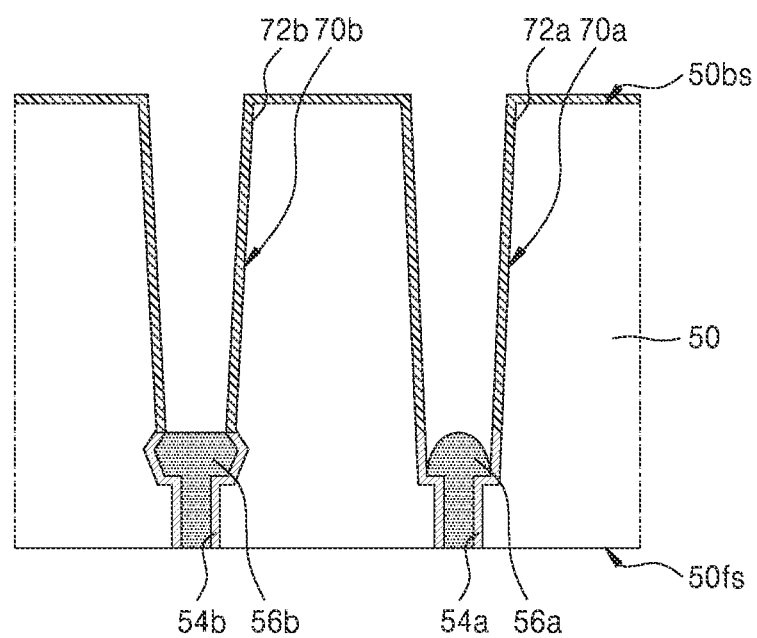

Referring to FIG. 6E, removal of the via hole liner layers 72a and 72b and the trench liner layers 54a and 54b on the TSV landing parts 56a and 56b is illustrated. The via hole liner layers 72a and 72b and the trench liner layers 54a and 54b on the TSV landing parts 56a and 56b may be removed from the insides of the TSV holes 70a and 70b.

Therefore, bottom surfaces of the TSV landing parts 56a and 56b may be exposed insides of the TSV holes 70a and 70b. That is, bottom surfaces of the TSV landing parts 56a and 56b in a direction toward the second surface 50bs may be exposed.

Figure 6F:
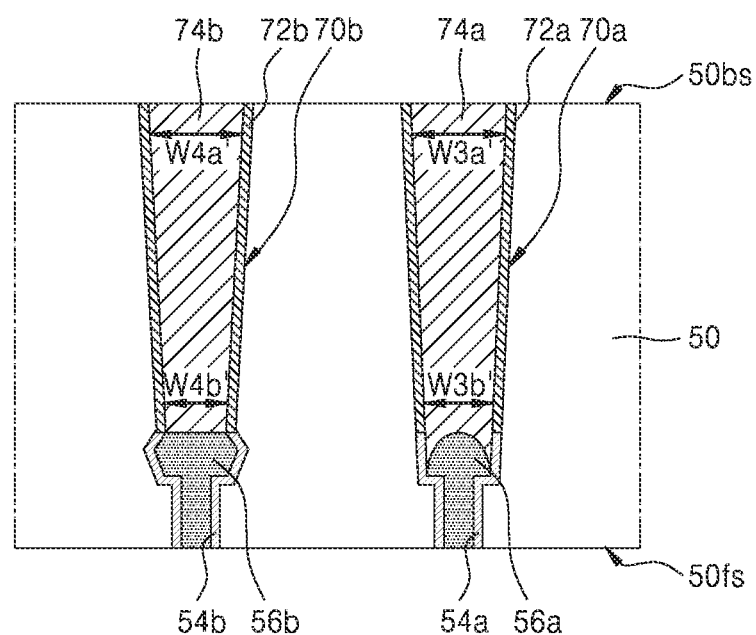

Referring to FIG. 6F, formation of the plurality of TSVs 74a and 74b is illustrated. The TSVs 74a and 74b may be formed by filling a conductive material layer into the TSV holes 70a and 70b with the via hole liner layers 72a and 72b formed therein. After the TSVs 74a and 74b are formed, the via hole liner layers 72a and 72b on the substrate 50 may be removed.

The TSVs 74a and 74b may be reliably formed on the TSV landing parts 56a and 56b where a lower width thereof is wide. Widths W3b' and W4b' of portions, which are farther away from the second surface 50bs and are adjacent to the lower TSV landing parts 56a2 and 56b2, of the TSVs 74a and 74b may be less than widths W3a' and W4a' of portions, which are close to the second surface 50bs, of the TSVs 74a and 74b.

Figure 7:
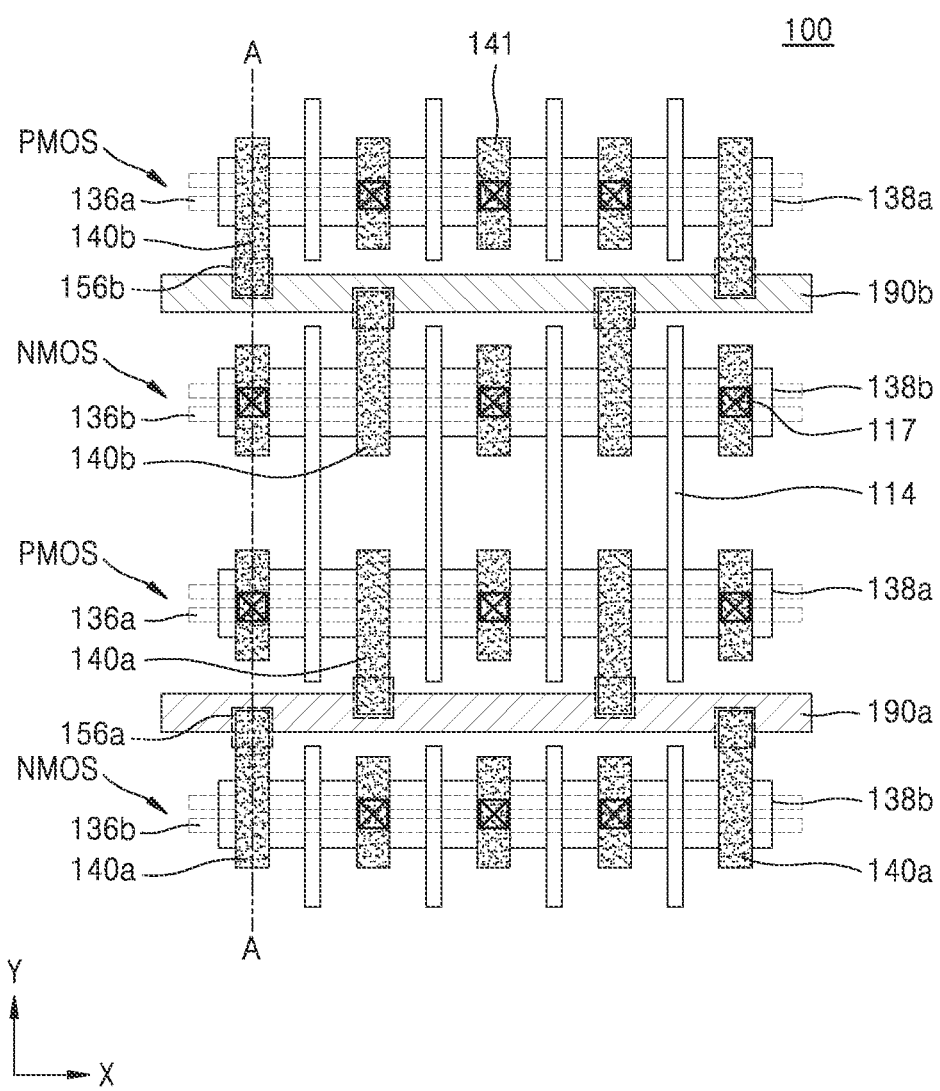
FIG. 7 is a layout view of an integrated circuit semiconductor device according to an embodiment.

FIG. 7 is a layout view of an integrated circuit semiconductor device 100 according to an embodiment.

Referring to FIG. 7, the integrated circuit semiconductor device 100 is an example of active elements, and a layout view including a plurality of finFET transistors (or fin-type transistors) is illustrated. In the integrated circuit semiconductor device 100, a layout view of a complementary metal-insulator-semiconductor transistor (CMOS) including a P-type metal-insulator-semiconductor (PMOS) transistor (a PMOS transistor) and an N-type metal-insulator-semiconductor (NMOS) transistor (an NMOS transistor) is illustrated as an example of active elements. Embodiments are not limited to the layout view of FIG. 7.

In the integrated circuit semiconductor device 100, a PMOS transistor and an NMOS transistor may be repeatedly disposed in a second direction (a Y direction). MOS transistors may each include a plurality of pins 136a and 136b extending in a first direction (an X direction). The pins 136a and 136b may include a plurality of P-type pins 136a and a plurality of N-type pin 136b. A plurality of gate lines 114

(for example, four gate lines) may be disposed across the pins 136a and 136b in the second direction (the Y direction) vertical to the first direction.

A plurality of source and drain regions 138a and 138b may be disposed at both sides of the gate lines 114 in the first direction. The source and drain regions 138a and 138b may include a plurality of P-type source and drain regions 138a and a plurality of N-type source and drain regions 138b.

Some portions of the source and drain regions 138a and 138b may be connected, through a plurality of local wirings 140a and 140b, to a power rail part 190b or a ground rail part 190a extending in the first direction. For example, some portions of the P-type source and drain regions 138a may be connected, through the local wiring 140b and TSV landing part 156b, to the power rail part 190b extending in the first direction. Some portions of the N-type source and drain regions 138b may be connected, through the local wiring 140a and TSV landing part 156a, to the ground rail part 190a extending in the first direction. Some portions of the source and drain regions 138a and 138b may be connected to a wiring layer through a local wiring 141 and a contact wiring 117.

Figure 8:
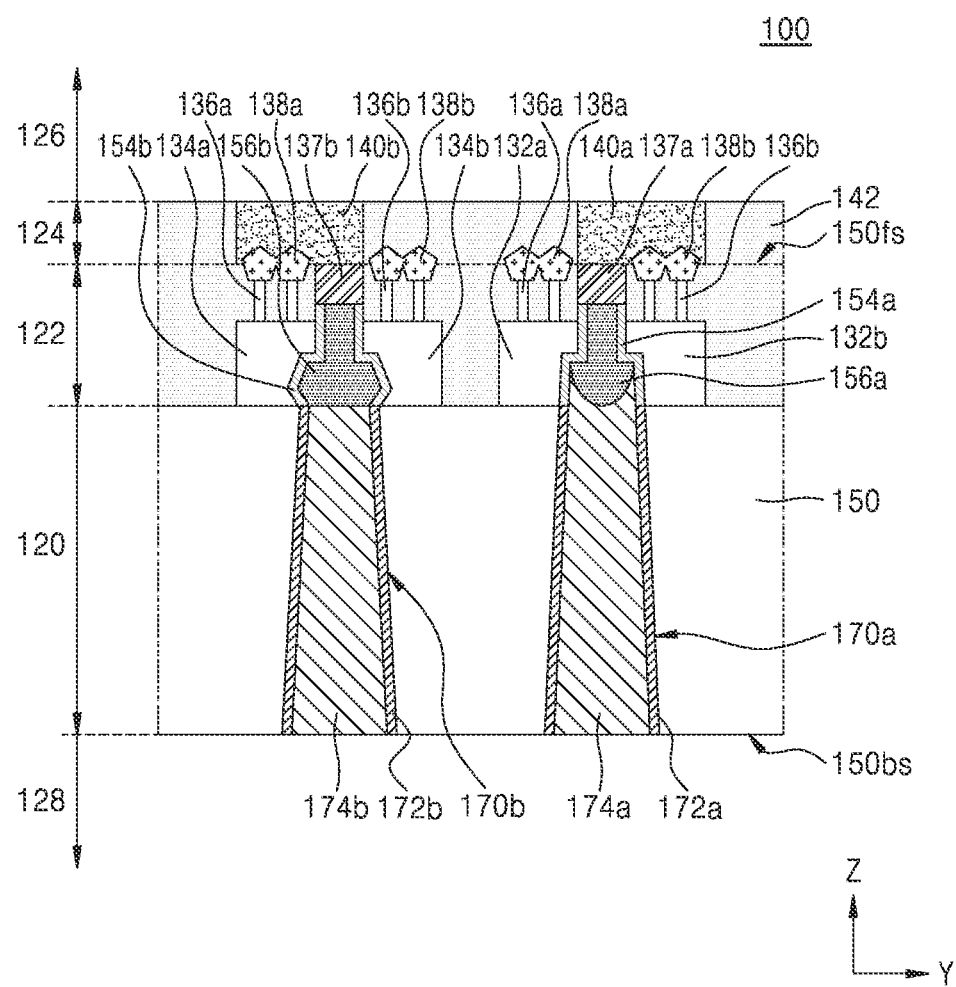
FIG. 8 is a cross-sectional view along line A-A of FIG. 7.

FIG. 8 is a cross-sectional view along line A-A of FIG. 7.

In detail, with the exception of a plurality of active elements (for example, finFET transistors), the integrated circuit semiconductor device 100 may be substantially the same as the integrated circuit semiconductor device 10 of FIG. 1. In the integrated circuit semiconductor device 100 of FIG. 7, the active elements will be mainly described, and description which is the same as or similar to the description of FIG. 1 will be only briefly given or omitted. Furthermore, in the integrated circuit semiconductor device 100 of FIG. 7, except for a relationship with the active elements, a plurality of TSV landing parts 156a and 156b and a plurality of TSVs 174a and 174b will be only briefly described.

Referring to FIG. 8, the integrated circuit semiconductor device 100 may include a substrate 150 which includes a first surface 150fs and a second surface 150bs opposite to the first surface 150fs. The substrate 150 may correspond to the substrate 50 of FIG. 1. The first surface 150fs may be a front surface of the substrate 150. The second surface 150bs may be a rear surface of the substrate 150.

The integrated circuit semiconductor device 100 may include a plurality of TSV landing parts 156a and 156b and a plurality of TSVs 174a and 174b. The TSV landing parts 156a and 156b may be buried into the substrate 150. The TSV landing parts 156a and 156b may be connected to the power rail part 190b or the ground rail part 190a of FIG. 7.

The TSV landing parts 156a and 156b may correspond to the TSV landing parts 56a and 56b of FIG. 1. Each of the TSV landing parts 156a and 156b may be configured so that a portion thereof apart from the first surface 150fs in a direction toward the second surface 150bs is wider in width than a portion thereof adjacent to the first surface 150fs. A plurality of trench liner layers 154a and 154b may be formed to surround the TSV landing parts 156a and 156b. The trench liner layers 154a and 154b may correspond to the trench liner layers 54a and 54b of FIG. 1.

The TSVs 174a and 174b may be buried into a plurality of TSV holes 170a and 170b, which are aligned with bottom surfaces of the TSV landing parts 156a and 156b from the second surface 150bs. A plurality of via hole liner layers 172a and 172b may be formed at inner sidewalls of the TSV holes 170a and 170b. The first and second TSV holes 170a and 170b may correspond to the first and second TSV holes 70a and 70b of FIG. 1. The via hole liner layers 172a and 172b may correspond to the via hole liner layers 72a and 72b of FIG. 1. The TSVs 174a and 174b may correspond to the TSVs 74a and 74b of FIG. 1.

Each of the TSV landing parts 156a and 156b may be configured so that a lower portion thereof is wider in width than an upper portion thereof, and thus, the TSVs 174a and 174b may be easily formed, whereby the TSV landing parts 156a and 156b may also be easily formed.

In the integrated circuit semiconductor device 100, a plurality of well regions 132a, 132b, 134a, and 134b may be provided for forming the active elements on the substrate 150. The well regions 132a, 132b, 134a, and 134b may be provided as one body with the substrate 150. In some embodiments, each of the well regions 132a and 134a may be a P-well region, and each of the well regions 132b and 134b may be an N-well region.

The well regions 132a, 132b, 134a, and 134b may be classified into a plurality of first well regions 132a and 132b and a plurality of second well regions 134a and 134b. The plurality of first well regions 132a and 132b and the plurality of second well regions 134a and 134b may be divided by an insulation layer 142.

A plurality of pins 136 spaced apart from one another may be formed on the well regions 132a, 132b, 134a, and 134b. The pins 136a and 136b may be formed apart from each other in the second direction (the Y direction). The pins 136a and 136b may include a plurality of P-type pins 136a and a plurality of N-type pin 136b. A plurality of source and drain regions 138a and 138b may be formed on the pins 136a and 136b. A plurality of P-type source and drain regions 138a may be formed on the P-type pins 136a. A plurality of N-type source and drain regions 138b may be formed on the N-type pins 136b.

The TSV landing part 156a may be formed between the first well regions 132a and 132b and between the P-type pins 136a and the N-type pins 136b. The TSV landing part 156b may be formed between the second well regions 134a and 134b and between the P-type pins 136a and the N-type pins 136b.

The TSV landing part 156a may be connected to a first contact plug 137a through a first local wiring 140a connected to the first contact plug 137a. The TSV landing part 156b may be connected to a second contact plug 137b through a second local wiring 140b connected to the second contact plug 137b. The first and second contact plugs 137a and 137b may be insulated from the first and second local wirings 140a and 140b by the insulation layer 142.

In some embodiments, elements such as the TSV landing parts 156a and 156b, the TSVs 174a and 174b, and the active elements may be formed in an FEOL manufacturing process 122 and a middle end of line (MEOL) manufacturing process 120. In some embodiments, elements such as contact plugs and local wirings may be formed in a middle end of line (MEOL) manufacturing process 124.

Elements on the first and second contact plugs 137a and 137b and the first and second local wirings 140a and 140b on the first surface 150fs may be formed in a BEOL manufacturing process 126. Elements on the TSVs 174a and 174b on the second surface 150bs may be formed in a BEOL manufacturing process 128.

Figure 9A:
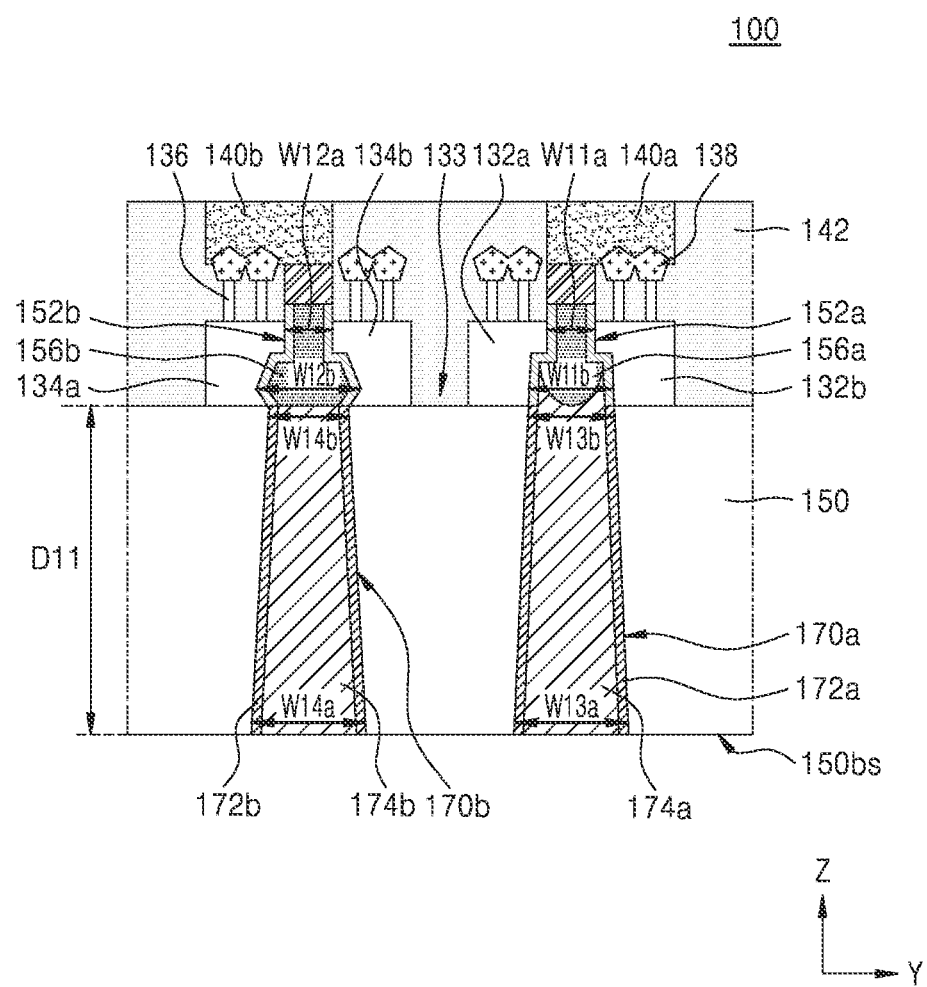
FIGS. 9A and 9B are detailed cross-sectional views of the integrated circuit semiconductor device of FIG. 8.
Figure 9B:
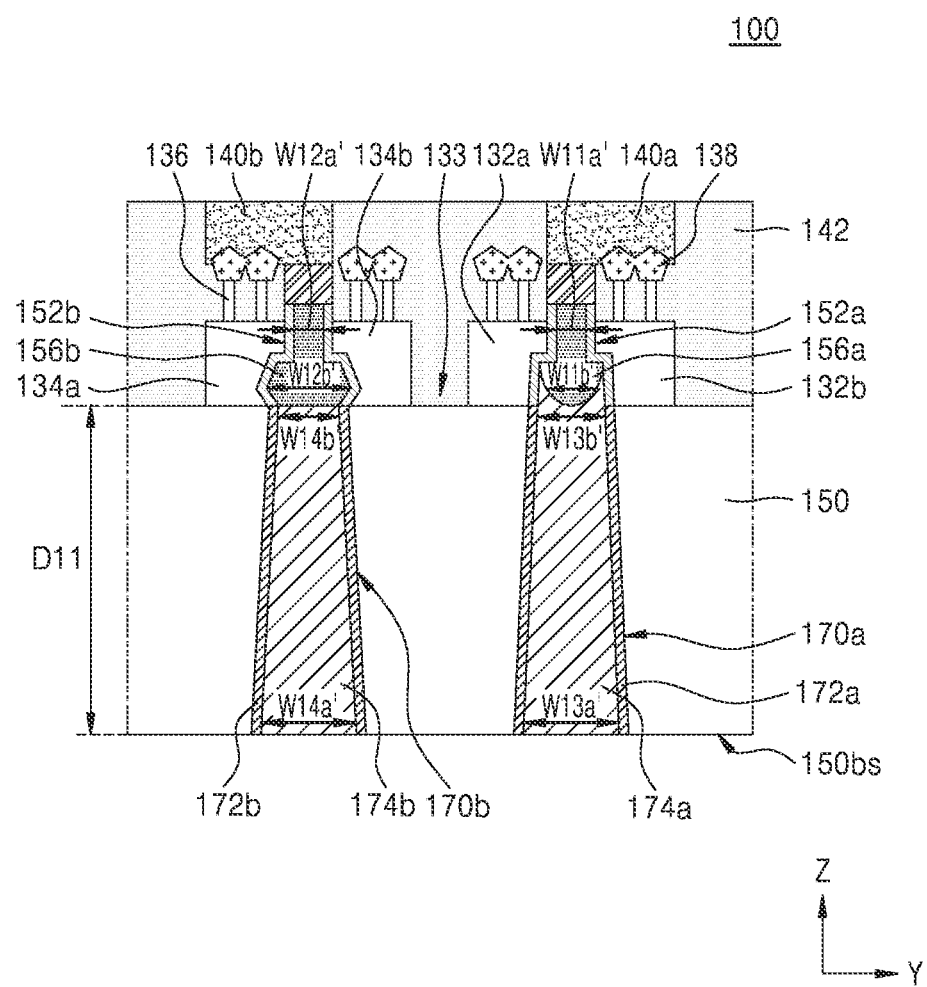

FIGS. 9A and 9B are detailed cross-sectional views provided for describing the integrated circuit semiconductor device 100 of FIG. 8.

In detail, in the integrated circuit semiconductor device 100, a plurality of active elements may be formed on the substrate 150. The active elements may be finFET transistors. The active elements may include the plurality of well regions 132a, 132b, 134a, and 134b, the plurality of pins 136

(136a to 136d of FIG. 8), and the plurality of source and drain regions 138 (138a and 138b of FIG. 8). A portion of the insulation layer 142 (i.e., portion 133) may be formed to divide between the plurality of first well regions 132a and 132b and the plurality of second well regions 134a and 134b.

The integrated circuit semiconductor device 100 may include the plurality of TSV landing parts 156a and 156b. The TSV landing parts 156a and 156b may be buried into the plurality of trenches 152a and 152b which are formed to a certain depth from the first surface (150fs of FIG. 8) of the substrate 150. As illustrated in FIG. 9A, the trenches 152a and 152b may respectively have upper widths W11a and W12a. The trenches 152a and 152b may respectively have lower widths W11b and W12b. The lower widths W11b and W12b may be greater than the upper widths W11a and W12a.

As illustrated in FIG. 9B, due to a thickness of each of the plurality of trench liner layers (154a and 154b of FIG. 8), the upper TSV landing parts 156a and 156b may respectively have upper widths W11a' and W12a' which are less than the upper widths W11a and W12a of the trenches 152a and 152b. The TSV landing parts 156a and 156b may respectively have lower widths W11b' and W12b' which are less than the lower widths W11b and W12b of the trenches 152a and 152b. The lower widths W11b' and W12b' of the TSV landing parts 156a and 156b may be greater than the upper widths W11a' and W12a' of the TSV landing parts 156a and 156b. The upper widths W11a' and W12a' may be relative concepts of the lower widths W11b' and W12b'.

The plurality of TSVs 174a and 174b of the integrated circuit semiconductor device 100 may be buried into the plurality of TSV holes 170a and 170b having a depth D11 from the second surface 150bs of the substrate 150. In some embodiments, as illustrated in FIG. 9A, widths W13a and W14a of portions, which are adjacent to the second surface 150bs, of the TSV holes 170a and 170b may be greater than widths W13b and W14b of portions, which are farther away from the second surface 150bs and are adjacent to the TSV landing parts 156a and 156b, of the TSV holes 170a and 170b.

The plurality of via hole liner layers 172a and 172b may be formed on inner sidewalls of the TSV holes 170a and 170b. The TSVs 174a and 174b may be buried into the via hole liner layers 172a and 172b in the TSV holes 170a and 170b. As illustrated in FIG. 9B, due to a thickness of each of the via hole liner layers 172a and 172b, the TSVs 174a and 174b may respectively have widths W13a' and W14a' which are less than the widths W13a and W14a of the TSV holes 170a and 170b.

Portions, which are farther away from the second surface 150bs and are adjacent to the TSV landing parts 156a and 156b, of the TSVs 174a and 174b may respectively have widths W13b' and W14b'. The widths W13b' and W14b' of the TSVs 174a and 174b may be respectively less than W13a' and W14a' of the TSVs 174a and 174b. Each of the TSVs 174a and 174b may be formed to have a width which is progressively reduced in a direction oriented from the second surface 150bs to the first surface 150fs.

Figure 10A:
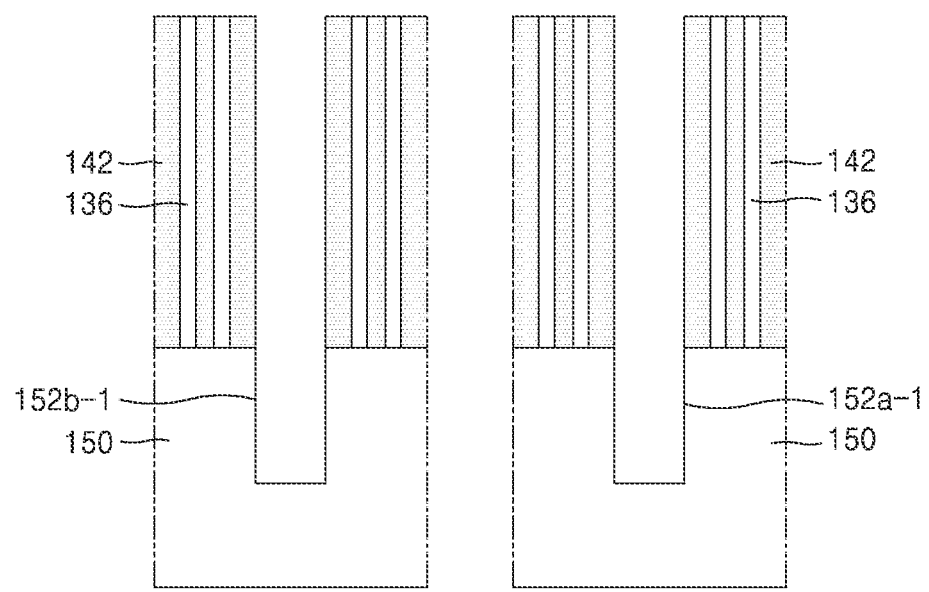
FIGS. 10A to 10C are cross-sectional views of stages in a method of manufacturing a TSV landing part of the integrated circuit semiconductor device in FIGS. 7 to 9B.
Figure 10B:
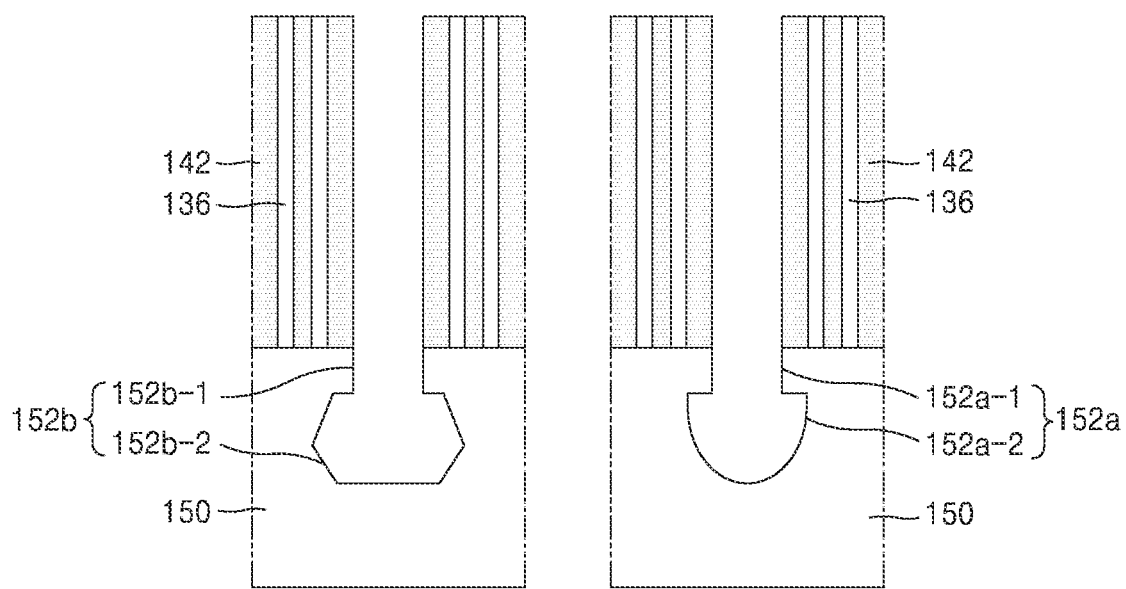
Figure 10C:
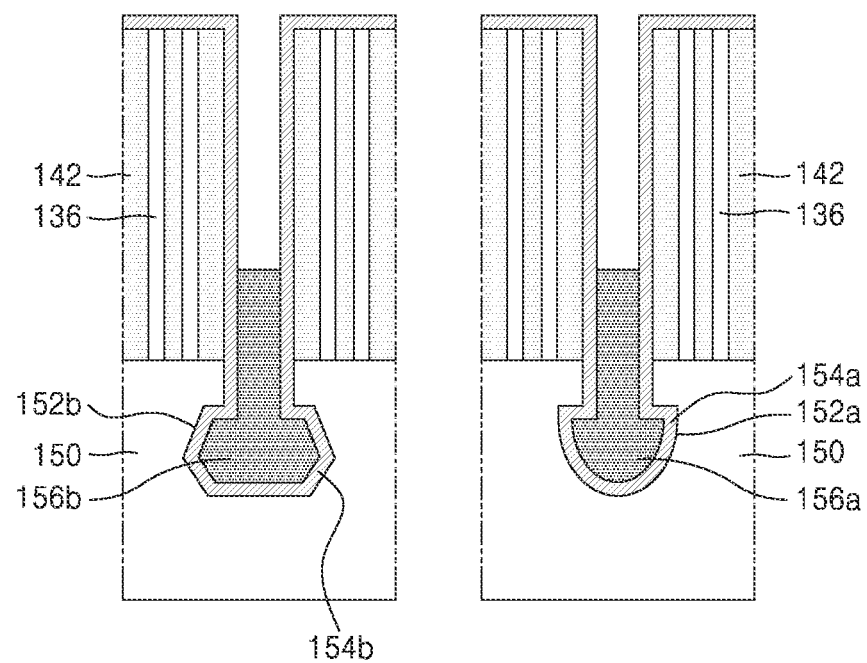

FIGS. 10A to 10C are cross-sectional views for describing in detail a process of manufacturing a TSV landing part of the integrated circuit semiconductor device 100 illustrated in FIGS. 7 to 9B.

Referring to FIG. 10A, formation of a plurality of upper trenches 152a-1 and 152b-1 on the substrate 150 is illustrated. The plurality of pins 136, which are elements of a plurality of active elements, may be formed on the substrate 150. A mask layer may be formed on the substrate 150 through a photolithography process, and then, the pins 136 may be formed by etching the substrate 150 by using the mask layer as an etch mask. Subsequently, the insulation layer 142 may be formed between the plurality of pins 136. Subsequently, the upper trenches 152a-1 and 152b-1 may be formed on the substrate 150 by selectively etching the insulation layer 142 and the substrate 150 through a photolithography process. The upper trenches 152a-1 and 152b-1 may be formed through an etching process (for example, an anisotropic etching process).

Referring to FIG. 10B, a plurality of lower trenches 152a-2 and 152b-2 may be formed by further etching the substrate 150 in communication with the upper trenches 152a-1 and 152b-1. The lower trenches 152a-2 and 152b-2 may be formed by isotropic-etching and/or anisotropic-etching the substrate 150. A cross-sectional shape (or form) of each of the lower trenches 152a-2 and 152b-2 may be determined based on a crystallization direction or an etching slope of the substrate 150. A generic name for the upper trenches 152a-1 and 152b-1 and the lower trenches 152a-2 and 152b-2 may be trenches 152a and 152b.

Referring to FIG. 10C, the plurality of trench liner layers 154a and 154b may be formed in the trenches 152a and 152b, and then, the plurality of TSV landing parts 156a and 156b may be formed on the trench liner layers 154a and 154b in the trenches 152a and 152b. A conductive layer or a metal layer may be buried into the trenches 152a and 152b, and then, the TSV landing parts 156a and 156b may be formed by recessing the trenches 152a and 152b to have a certain thickness. The trench liner layers 154a and 154b formed on the pins 136 and the insulation layer 142 may be removed through a subsequent process.

FIGS. 11A to 11H are cross-sectional views of stages in a method of manufacturing the integrated circuit semiconductor device illustrated in FIGS. 7 to 9B.

Figure 11A:
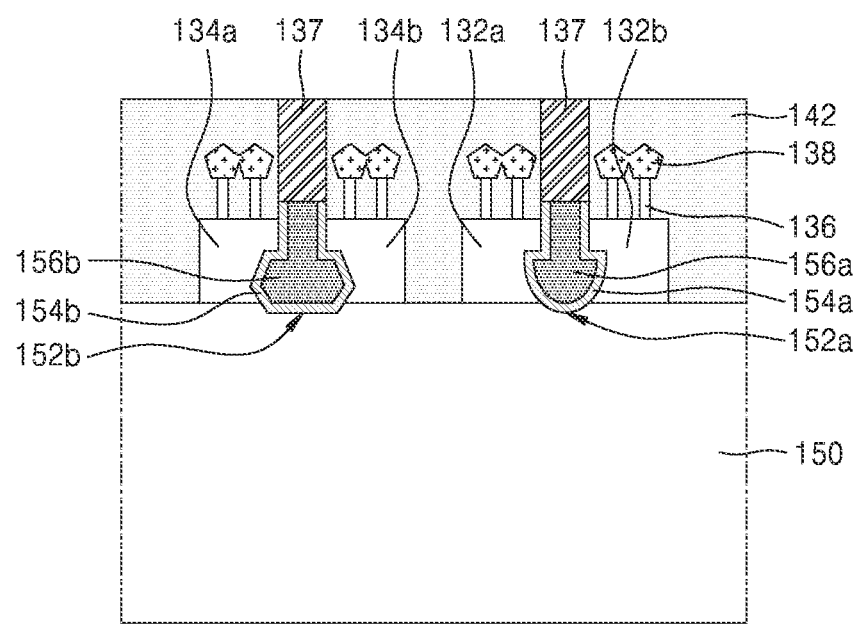
FIGS. 11A to 11H are cross-sectional views of stages in a method of manufacturing the integrated circuit semiconductor device in FIGS. 7 to 9B.

Referring to FIG. 11A, formation of a plurality of active elements and the plurality of TSV landing parts 156a and 156b on the substrate 150 is illustrated. The active elements may be finFET transistors. The active elements may include the plurality of well regions 132a, 132b, 134a, and 134b, the plurality of pins 136, and the source and drain region 138. For example, the plurality of well regions 132a, 132b, 134a, and 134b may include the plurality of first well regions 132a and 132b and the plurality of second regions 134a and 134b. The insulation layer 142 may be formed to divide between the first well regions 132a and 132b and the second regions 134a and 134b.

The plurality of trench liner layers 154a and 154b and the plurality of TSV landing parts 156a and 156b may be respectively formed in the trenches 152a and 152b between the first well regions 132a and 132b and between the second regions 134a and 134b. Forming the plurality of trench liner layers 154a and 154b and the plurality of TSV landing parts 156a and 156b was described above, and thus, their detailed descriptions are omitted.

Subsequently, a plug layer 137 may be formed on the TSV landing parts 156a and 156b in the trenches 152a and 152b. The plug layer 137 may be formed as a conductive layer, e.g., may be formed as a metal layer. The plug layer 137 may be formed, e.g., as a copper layer or a tungsten layer.

Figure 11B:
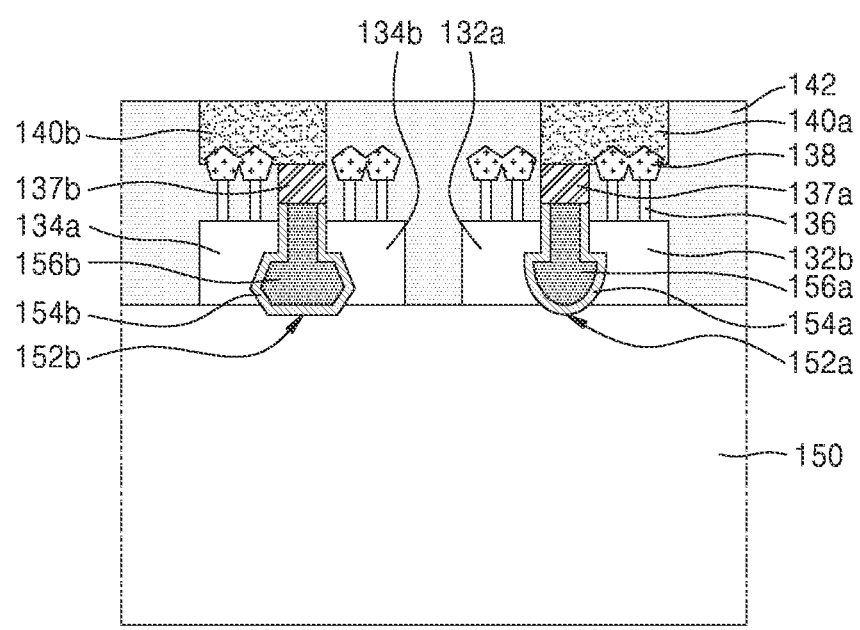

Referring to FIG. 11B, formation of a plurality of contact plugs 137a and 137b and a plurality of local wirings 140a and 140b is illustrated. The contact plugs 137a and 137b may be formed on the TSV landing parts 156a and 156b by recessing the plug layer 137.

Subsequently, the local wirings 140a and 140b electrically connected to the contact plugs 137a and 137b may be formed in the insulation layer 142. The local wirings 140a and 140b may be formed by using a metal layer. In the present embodiment, it has been described that the plurality of contact plugs 137a and 137b and the plurality of local wirings 140a and 140b are formed through different processes, but embodiments are not limited thereto and the plurality of contact plugs 137a and 137b and the plurality of local wirings 140a and 140b may be formed through the same process.

Figure 11C:
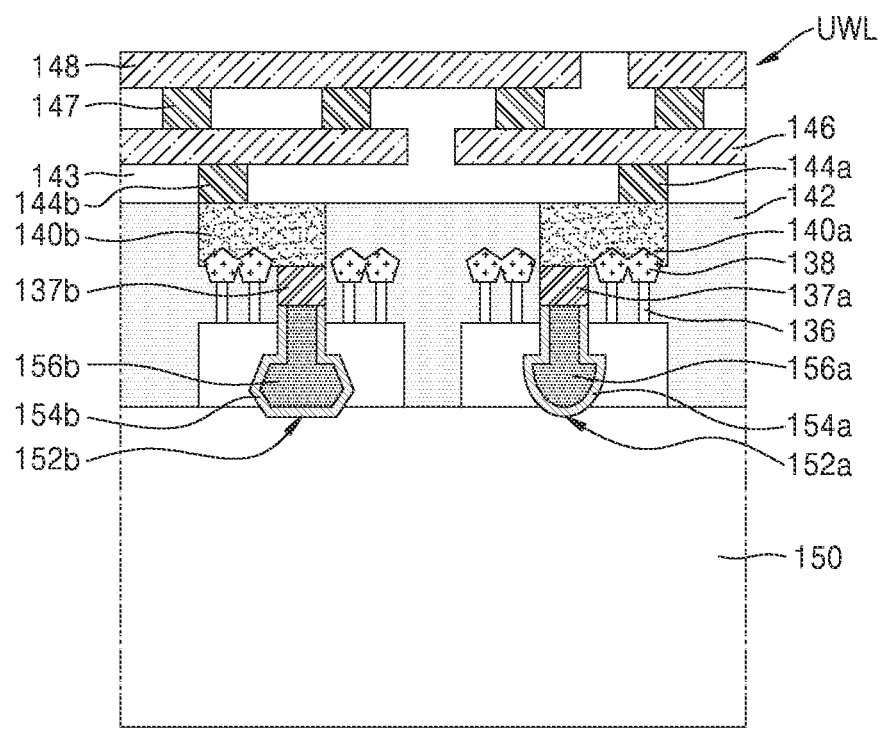

Referring to FIG. 11C, formation of an upper multilayer wiring layer UWL on the local wirings 140a and 140b and the insulation layer 142 is illustrated. The upper multilayer wiring layer UWL may include an inter-wiring insulation layer 143, a plurality of contact plugs 144a, 144b, and 147, and a plurality of wiring layers 146 and 148.

Figure 11D:
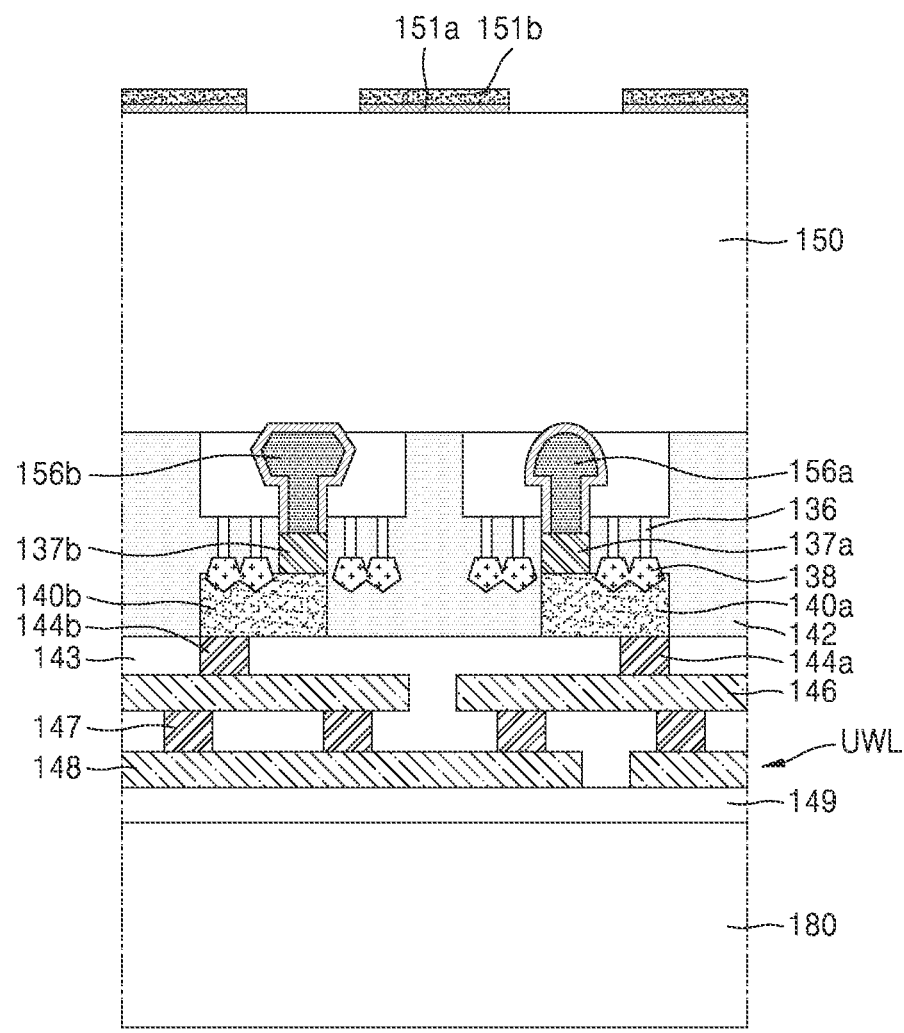
Figure 11E:
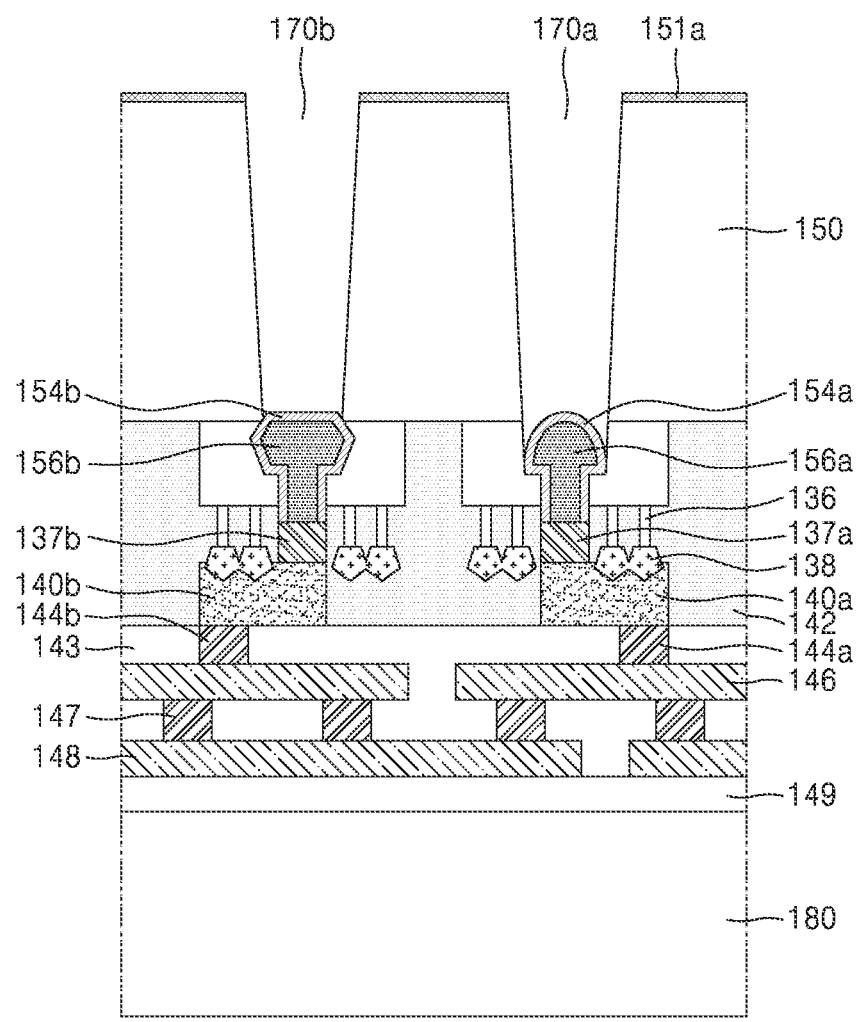

Referring to FIGS. 11D and 11E, formation of the plurality of TSV holes 170a and 170b is illustrated. As illustrated in FIG. 11D, the substrate 150 may be turned over, and a preliminary substrate 180 may be attached on the upper multilayer wiring layer UWL by using an adhesive insulation layer 149. The adhesive insulation layer 149 may be, e.g., an oxide layer. Subsequently, a plurality of mask layers 151a and 151b may be formed at the rear surface of the substrate 150 by using a photolithography process.

As illustrated in FIG. 11E, the plurality of TSV holes 170a and 170b may be formed by etching the substrate 150 by using each of the mask layers 151a and 151b as an etch mask. The mask layer 151b may be removed in forming the TSV holes 170a and 170b.

The TSV holes 170a and 170b may be aligned with and formed on the TSV landing parts 156a and 156b where a width of a bottom surface thereof is wider than that of a top surface thereof. Therefore, the TSV holes 170a and 170b may be reliably formed.

Figure 11F:
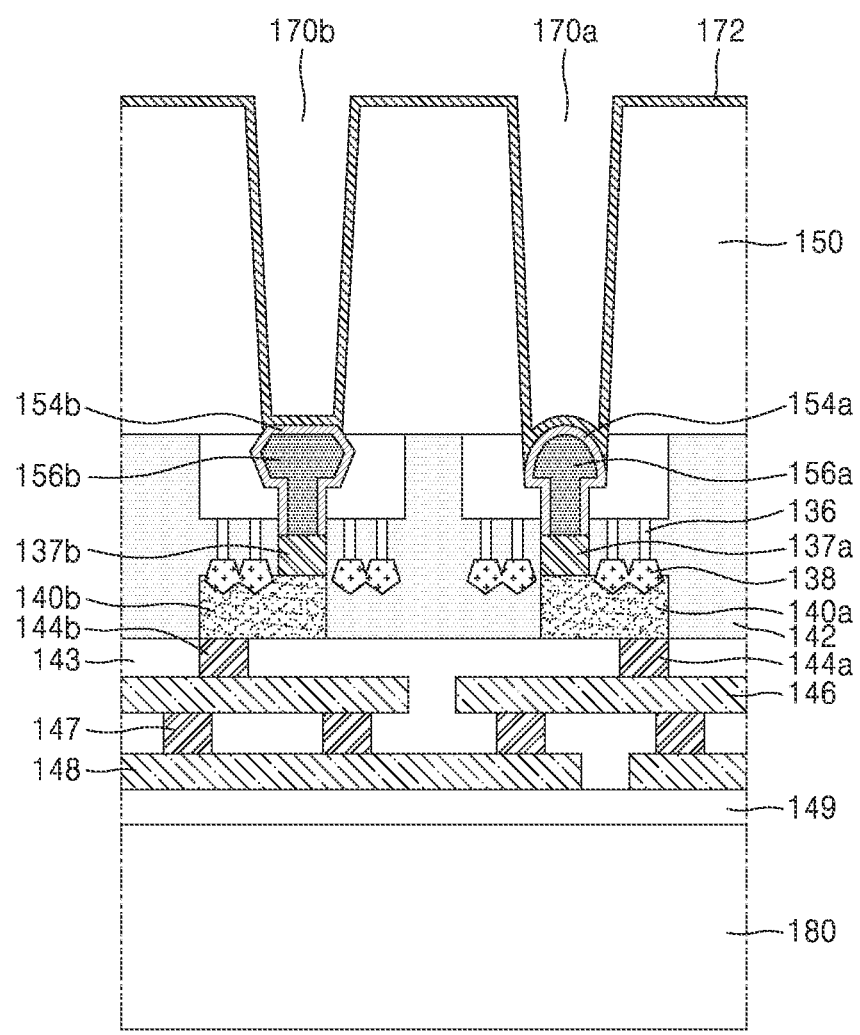

Referring to FIG. 11F, formation of the plurality of via hole liner layers 172a and 172b is illustrated. After the mask layer 151a is removed, a via hole liner material layer 172 may be formed on inner sidewalls and bottoms of the TSV holes 170a and 170b and the substrate 150. The via hole liner material layer 172 may be formed as an insulation layer, e.g., an oxide layer or a nitride layer.

Figure 11G:
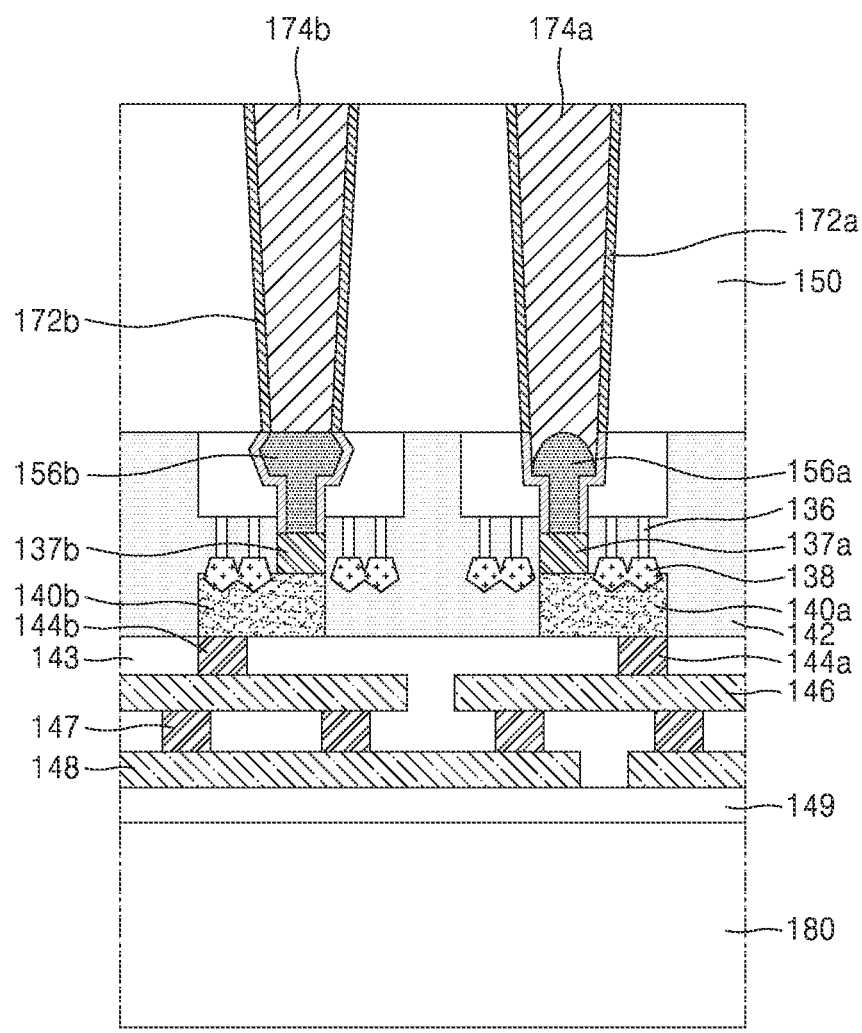

Referring to FIG. 11G, formation of the plurality of TSVs 174a and 174b is illustrated. First, the via hole liner material layer 172 formed on the rear surface of the substrate 150, the via hole liner material layer 172 in each of the TSV holes 170a and 170b, and the trench liner layers 154a and 154b on the TSV landing parts 156a and 156b may be removed.

Therefore, the via hole liner layers 172a and 172b may be formed at inner sidewalls of the TSV holes 170a and 170b, and bottom surfaces of the TSV landing parts 156a and 156b may be exposed at the insides of the TSV holes 170a and 170b. Subsequently, the TSVs 174a and 174b may be formed by filling a conductive material layer into the TSV holes 170a and 170b with the via hole liner layers 172a and 172b formed therein.

Figure 11H:
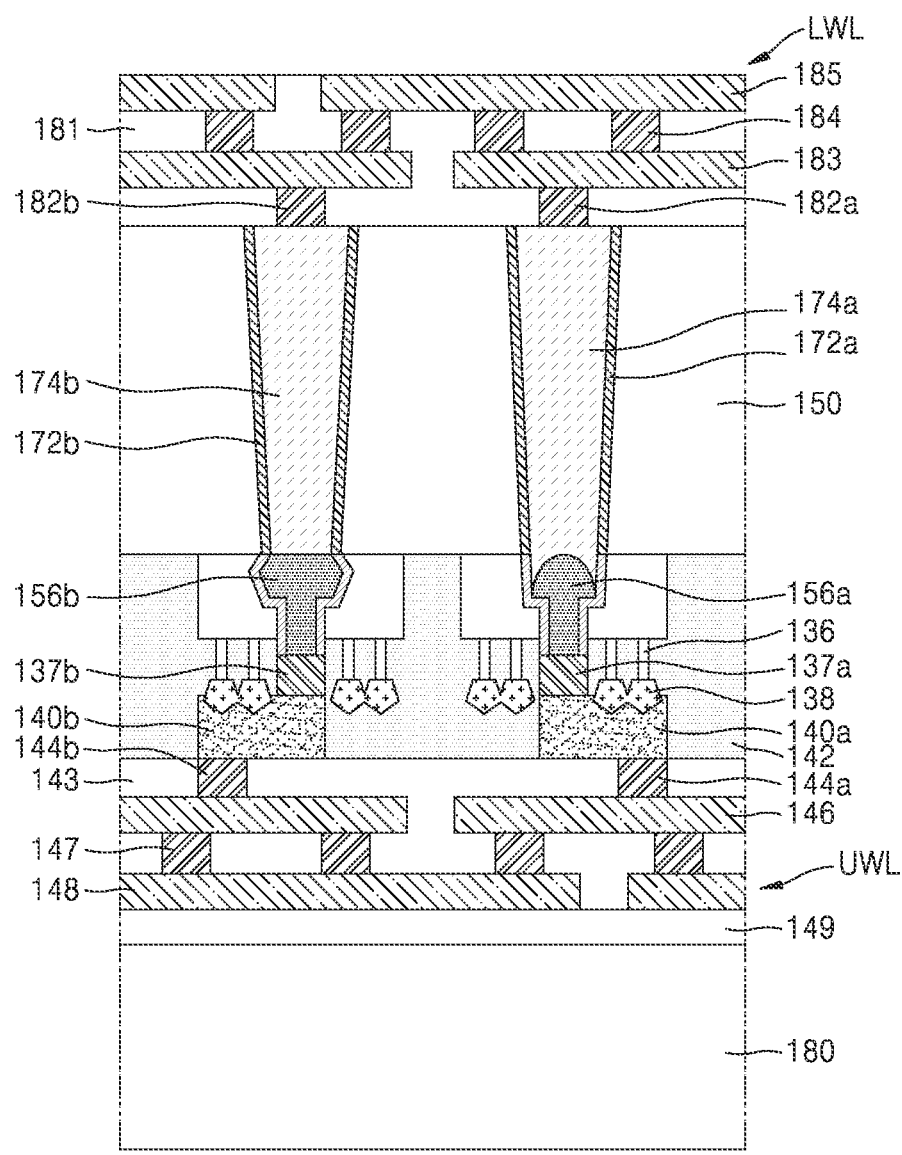

Referring to FIG. 11H, formation of a lower multilayer wiring layer LWL on the TSVs 174a and 174b is illustrated. The lower multilayer wiring layer LWL may include an inter-wiring insulation layer 181, a plurality of contact plugs 182a, 182b, and 184, and a plurality of wiring layers 183 and 185.

Figure 12:
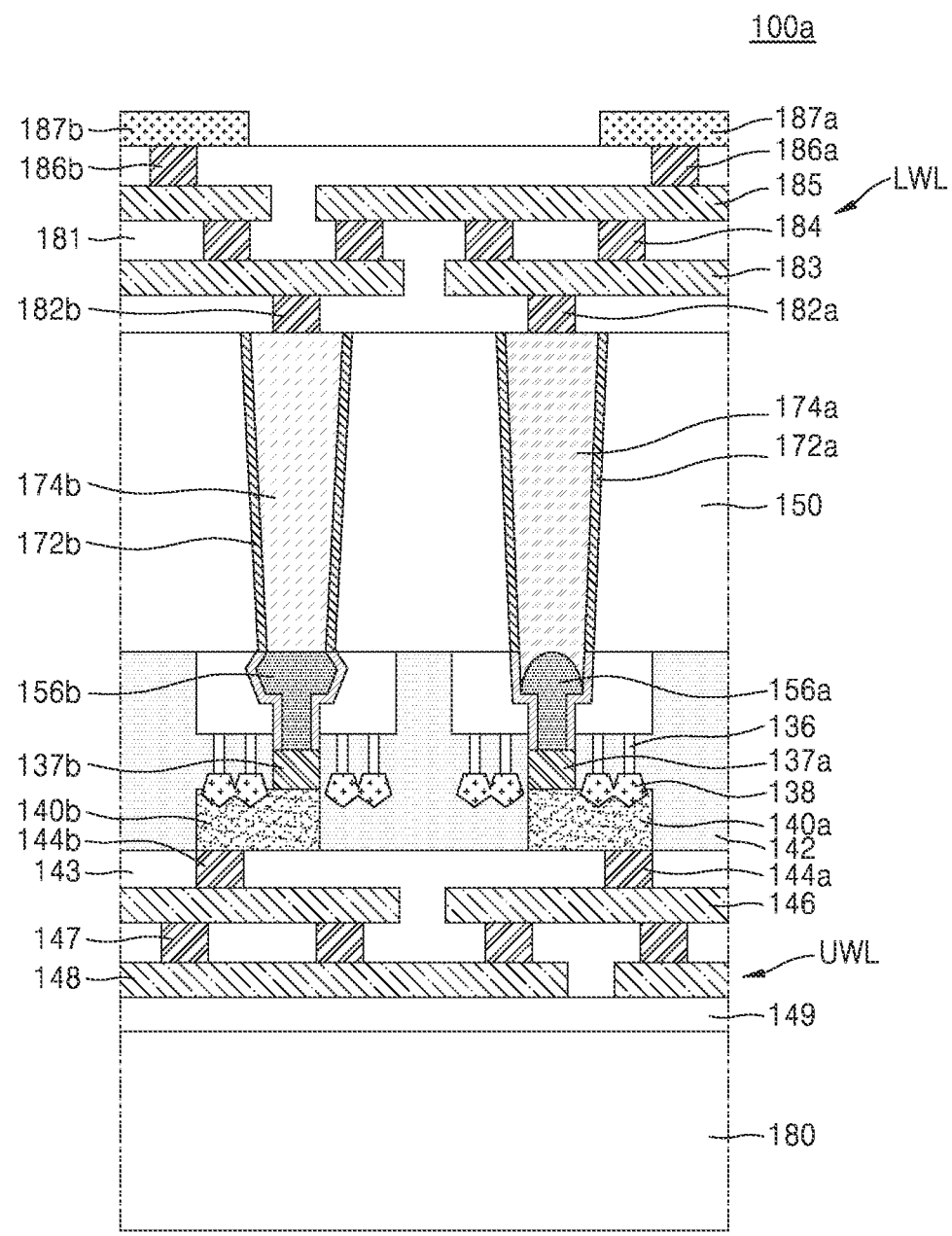
FIG. 12 is a cross-sectional view of an integrated circuit semiconductor device according to an embodiment.

FIG. 12 is a cross-sectional view of an integrated circuit semiconductor device 100a according to an embodiment.

In detail, with the exception of a plurality of power and ground terminals 187a and 187b, the integrated circuit semiconductor device 100a of FIG. 12 may be the same as the integrated circuit semiconductor device of FIG. 11H. In the integrated circuit semiconductor device 100a, the plurality of power and ground terminals 187a and 187b may be formed through a plurality of contact plugs 186a and 186b and on a wiring layer 185 configuring the lower multilayer wiring layer LWL.

Therefore, the power and ground terminals 187a and 187b of the integrated circuit semiconductor device 100a may be connected to a plurality of TSV landing parts 156a and 156b via the lower multilayer wiring layer LWL and the TSVs 174a and 174b. The integrated circuit semiconductor device 100a may apply power or a ground voltage to a plurality of active elements through the TSV landing parts 156a and 156b connected to the power rail parts (190a and 190b of FIG. 7) or the ground rail parts (190a and 190b of FIG. 7) in a rear surface of the substrate 150 by using the power and ground terminals 187a and 187b.

Figure 13:
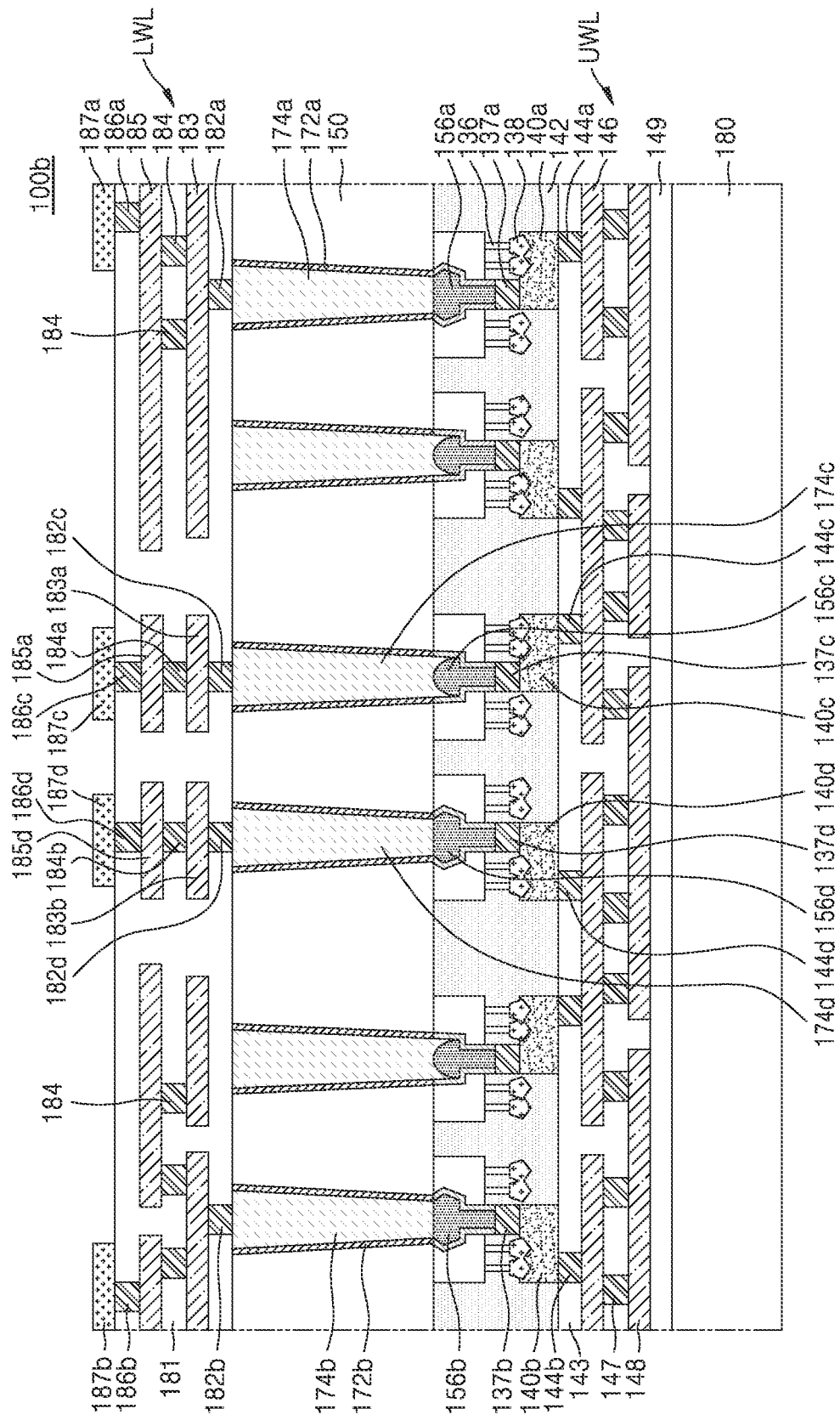
FIG. 13 is a cross-sectional view of an integrated circuit semiconductor device according to an embodiment.

FIG. 13 is a cross-sectional view of an integrated circuit semiconductor device 100b according to an embodiment.

In detail, with the exception of a plurality of signal input/output (I/O) terminals 187c and 187d, the integrated circuit semiconductor device 100b of FIG. 13 may be the same as the integrated circuit semiconductor device 100a of FIG. 12. In the integrated circuit semiconductor device 100b, the plurality of signal I/O terminals 187c and 187d may be formed through a plurality of contact plugs 186c and 186d and on the wiring layer 185 configuring the lower multilayer wiring layer LWL.

The signal I/O terminals 187c and 187d may be electrically connected to a plurality of TSVs 174c and 174d through a plurality of wiring layers 183a, 183b, 185a, and 185d and a plurality of contact plugs 182c, 182d, 184a and 184b configuring the lower multilayer wiring layer LWL, and the contact plugs 186c and 186d. The TSVs 174c and 174d may be electrically connected to a plurality of active elements through a plurality of TSV landing parts 156c and 156d, a plurality of contact plugs 137c, 137d, 144c, and 144d, and a plurality of local wirings 140c and 140d. The plurality of contact plugs 144c, and 144d may be connected to the wiring layer 146 of the upper multilayer wiring layer UWL.

The integrated circuit semiconductor device 100b of FIG. 13 may apply power and a ground voltage by using the TSV landing parts 156a and 156b and the TSVs 174a and 174b and may apply a signal I/O voltage by using the TSV landing parts 156c and 156d and the TSVs 174c and 174d.

Figure 14:
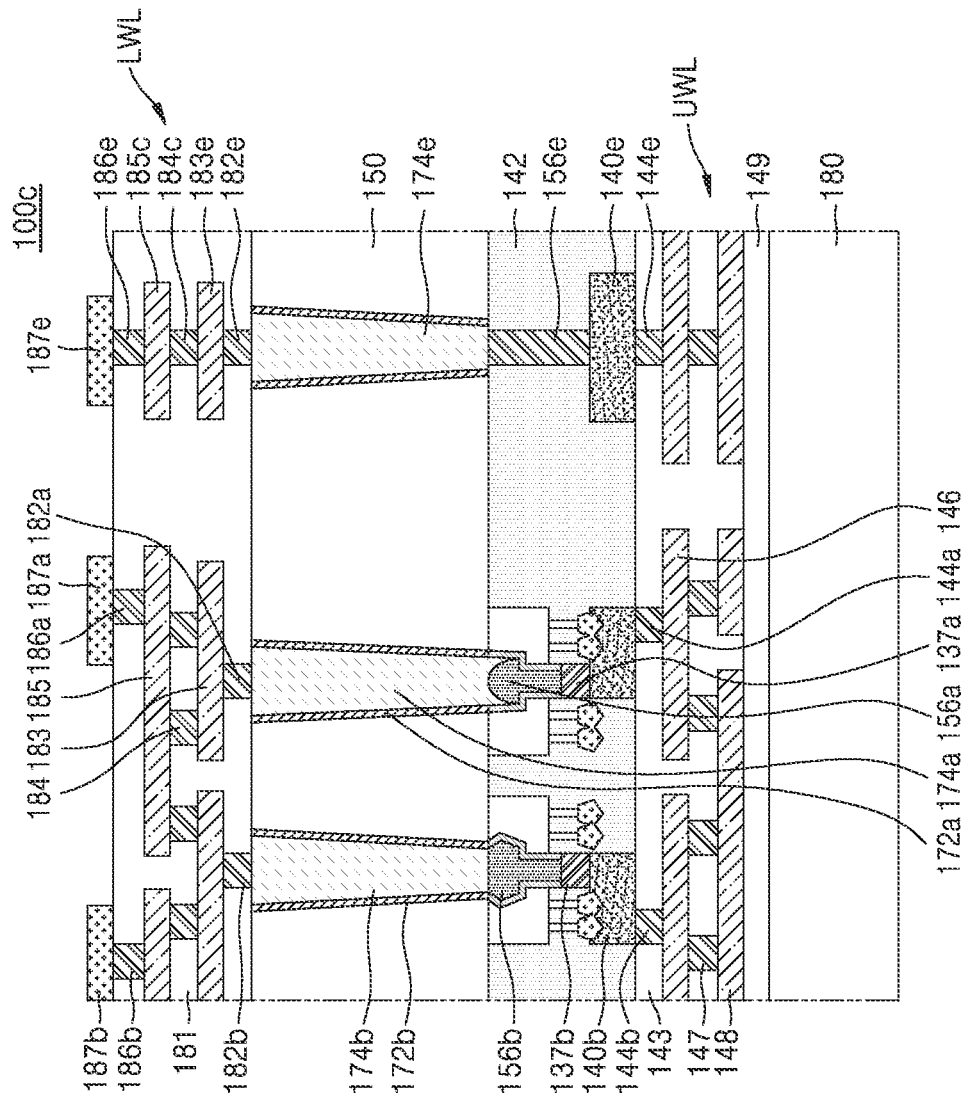
FIG. 14 is a cross-sectional view of an integrated circuit semiconductor device according to an embodiment.

FIG. 14 is a cross-sectional view of an integrated circuit semiconductor device 100c according to an embodiment.

In detail, with the exception of a signal I/O terminal 187e connected to an additional TSV 174e, the integrated circuit semiconductor device 100c of FIG. 14 may be the same as the integrated circuit semiconductor device 100a of FIG. 12. In the integrated circuit semiconductor device 100c, the signal I/O terminal 187e may be formed through a contact plug 186e and on a wiring layer 185c configuring the lower multilayer wiring layer LWL.

The signal I/O terminal 187e may be electrically connected to the additional TSV 174e through a plurality of wiring layers 183e and 185c and a plurality of contact plugs 182e, 184c configuring the lower multilayer wiring layer LWL, and the contact plug 186e. The additional TSV 174e may not electrically be connected to a plurality of TSVs 174a and 174b.

The integrated circuit semiconductor device 100c of FIG. 14 may apply power and a ground voltage by using the TSV landing parts 156a and 156b and the TSVs 174a and 174b, and may apply a signal I/O voltage by using the additional TSV 174e, a local wiring 140e, a plurality of contact plugs 156e, 144e, and 147, and a plurality of wiring layers 146 and 148.

Figure 15:
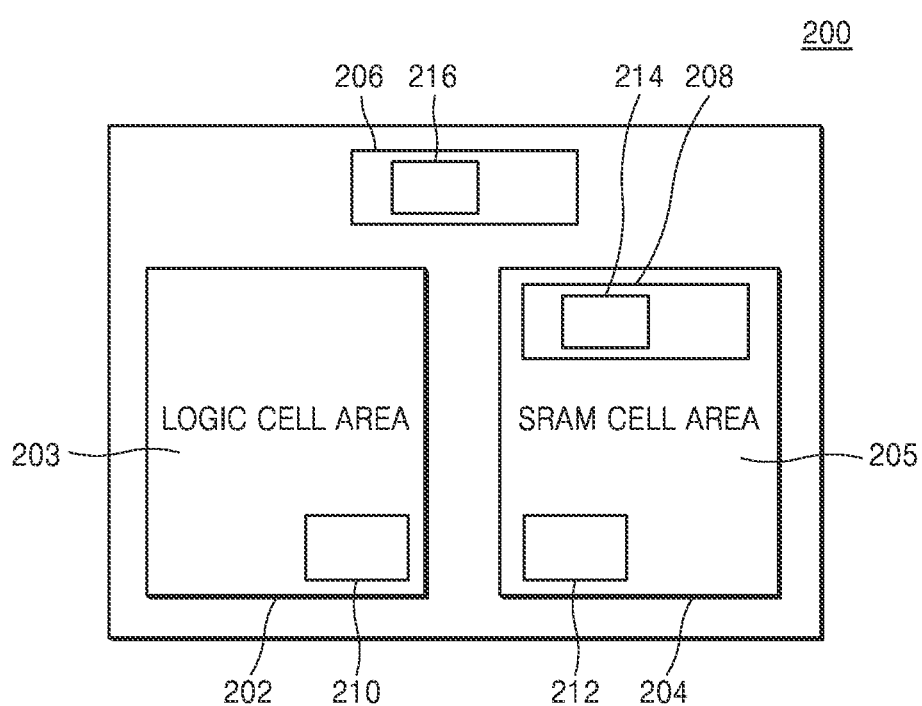
FIG. 15 is a block diagram of a semiconductor chip including an integrated circuit semiconductor device according to embodiments.

FIG. 15 is a block diagram illustrating a semiconductor chip 200 including an integrated circuit semiconductor device according to embodiments.

In detail, the semiconductor chip 200 may include a logic area 202, an SRAM area 204, and an I/O area 206. The logic area 202 may include a logic cell area 203. The SRAM area 204 may include an SRAM cell area 205 and an SRAM peripheral circuit area 208. A first transistor 210 may be disposed in the logic cell area 203, and a second transistor 212 may be disposed in the SRAM cell area 205. A third transistor 214 may be formed in the SRAM peripheral circuit area 208, and a fourth transistor 216 may be disposed in the I/O area 206.

The semiconductor chip 200 may include one or more of the integrated circuit semiconductor devices 100a, 100b, and 100c according to an embodiment. In some embodiments, each of the first transistor 210, the second transistor 212, the third transistor 214, and the fourth transistor 216 may include a fin-type transistor described above.

Figure 16:
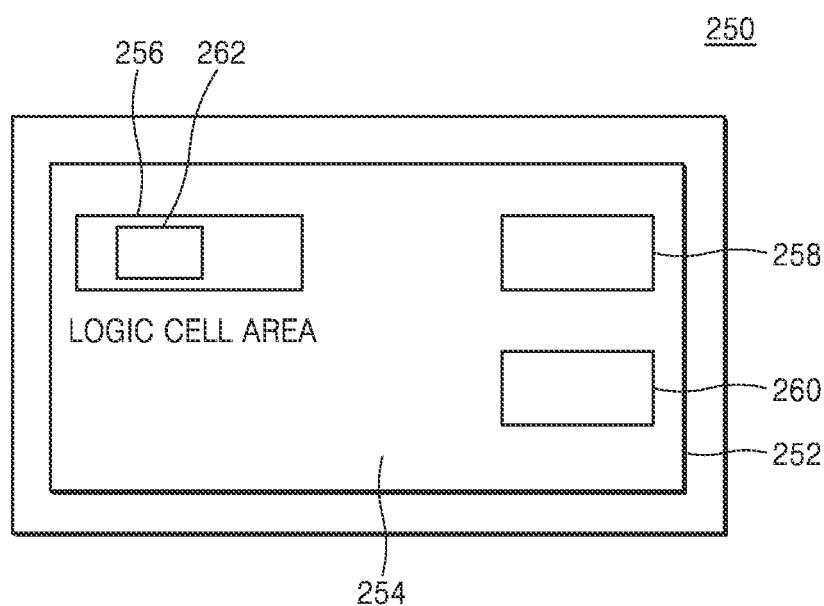
FIG. 16 is a block diagram of a semiconductor chip including an integrated circuit semiconductor device according to embodiments.

FIG. 16 is a block diagram illustrating a c semiconductor chip 250 including an integrated circuit semiconductor device according to embodiments.

In detail, the semiconductor chip 250 may include a logic area 252. The logic area 252 may include a logic cell area 254 and an I/O area 256. A first transistor 258 and a second transistor 260 may be disposed in the logic cell area 254. The first transistor 258 and the second transistor 260 may be transistors having different conductive types. A third transistor 262 may be disposed in the I/O area 256.

The semiconductor chip 250 may include one or more of the integrated circuit semiconductor devices 100a, 100b, and 100c according to an embodiment. In some embodiments, each of the first transistor 258, the second transistor 260, and the third transistor 262 may include a fin-type transistor described above.

Figure 17:
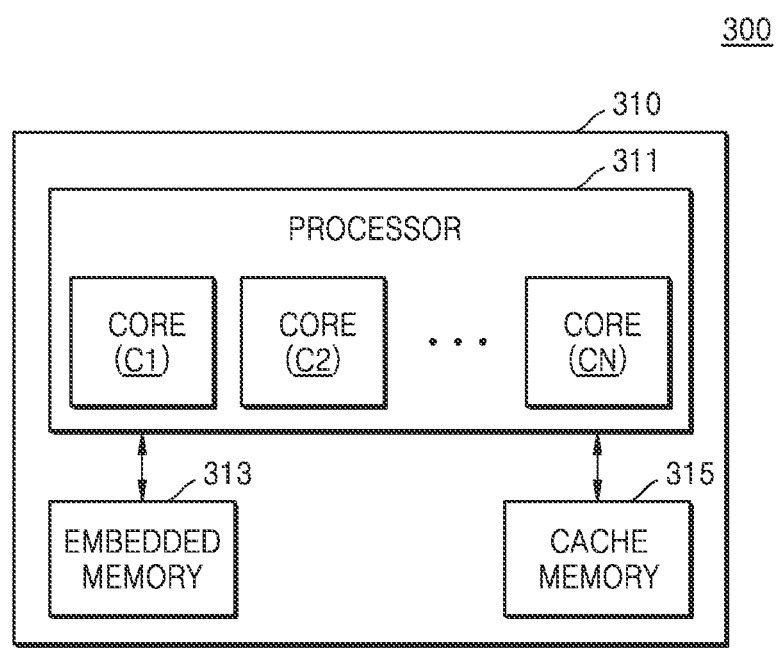
FIG. 17 is a block diagram of an electronic device including an integrated circuit semiconductor device according to embodiments.

FIG. 17 is a block diagram illustrating an electronic device 300 including an integrated circuit semiconductor device according to embodiments.

In detail, the electronic device 300 may include a system-on chip (SoC) 310. The SoC 310 may include a processor 311, an embedded memory 313, and a cache memory 315. The processor 311 may include one or more processor cores C1 to Cn. The processor cores C1 to Cn may process data and a signal. The processor cores C1 to Cn may each include one or more of the integrated circuit semiconductor devices 100a, 100b, and 100c according to embodiments.

The electronic device 300 may perform a unique function by using processed data and a processed signal. For example, the processor 311 may be an application processor. The embedded memory 313 may exchange first data DATA1 with the processor 311. The first data DATA1 may be data which is obtained through processing by each of the processor cores C1 to Cn or is to be processed by the processor cores C1 to Cn. The embedded memory 313 may manage the first data DATA1. For example, the embedded memory 313 may buffer the first data DATA1. The embedded memory 313 may operate as a buffer memory or a working memory of the processor 311.

The embedded memory 313 may be SRAM. SRAM may operate at a higher speed than dynamic random access memory (DRAM). When SRAM is embedded into the SoC 310, the electronic device 300 which has a small size and operates at a fast speed may be implemented. Furthermore, when SRAM is embedded into the SoC 310, the amount of consumed active power of the electronic device 300 may decrease.

For example, SRAM may include an integrated circuit semiconductor device according to embodiments. The cache memory 315 and the processor cores C1 to Cn may be mounted on the SoC 310. The cache memory 315 may store cache data DATc. The cache data DATc may be data which is used by the processor cores C1 to Cn. The cache memory 315 may have a small storage capacity, but may operate at a very fast speed.

For example, the cache memory 315 may include SRAM including an integrated circuit semiconductor device according to embodiments. In a case where the cache memory 315 is used, the number of accesses of the embedded memory 313 by the processor 311 and a time for which the processor 311 accesses the embedded memory 313 may decrease. Therefore, in a case where the cache memory 315 is used, an operating speed of the electronic device 300 may increase. To help understanding, in FIG. 17, each of the cache memory 315 and the processor 311 is illustrated as an individual element. However, the cache memory 315 may be configured to be included in the processor 311.

Figure 18:
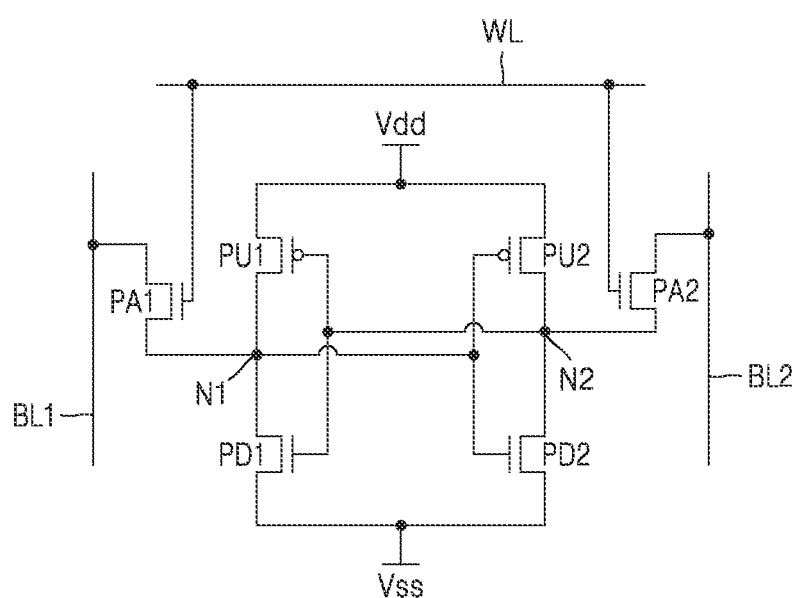
FIG. 18 is an equivalent circuit diagram of a static random access memory (SRAM) cell according to embodiments.

FIG. 18 is an equivalent circuit diagram of an SRAM cell according to embodiments.

In detail, the SRAM cell may be implemented based on the integrated circuit semiconductor devices 100a, 100b, and 100c according to embodiments. For example, the SRAM cell may be applied to the embedded memory 313 and/or the cache memory 315 each described above with reference to FIG. 17.

The SRAM cell may include a first pull-up transistor PU1, a first pull-down transistor PD1, a second pull-up transistor PU2, a second pull-down transistor PD2, a first access transistor PA1, and a second access transistor PA2. The first and second pull-up transistors PU1 and PU2 may be PMOS transistors, and the first and second pull-down transistors PD1 and PD2 and the first and second access transistors PA1 and PA2 may be NMOS transistors.

The first pull-up transistor PU1 and the first pull-down transistor PD1 may configure a first inverter. Gate electrodes (gates), connected to each other, of the first pull-up transistor PU1 and the first pull-down transistor PD1 may each correspond to an input terminal of the first inverter, and a first node N1 may correspond to an output terminal of the first inverter.

The second pull-up transistor PU2 and the second pull-down transistor PD2 may configure a second inverter. Gate electrodes (gates), connected to each other, of the second pull-up transistor PU2 and the second pull-down transistor PD2 may each correspond to an input terminal of the second inverter, and a second node N2 may correspond to an output terminal of the second inverter.

A latch structure may be configured by a combination of the first and second inverters. The gate electrodes of the first pull-up transistor PU1 and the first pull-down transistor PD1 may be electrically connected to the second node N2, and the gate electrodes of the second pull-up transistor PU2 and the second pull-down transistor PD2 may be electrically connected to the first node N1.

A first source/drain of the first access transistor PA1 may be connected to the first node N1, and a second source/drain of the first access transistor PA1 may be connected to a first bit line BL1. A first source/drain of the second access transistor PA2 may be connected to the second node N2, and a second source/drain of the second access transistor PA2 may be connected to a second bit line BL2.

Gate electrodes of the first and second access transistors PA1 and PA2 may be electrically connected to a word line WL. Therefore, the SRAM cell may be implemented by using the integrated circuit semiconductor devices 100a, 100b, and 100c according to embodiments.

By way of summation and review, when a size, e.g., a diameter or a width, of a TSV is reduced, it may be difficult to reliably form a TSV. Therefore, embodiments provide an integrated circuit semiconductor device in which a TSV is reliably formed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit semiconductor device, comprising:
   a substrate including a first surface and a second surface opposite the first surface;
   a trench in the substrate, the trench extending from the first surface of the substrate toward the second surface of the substrate;
   a through silicon via (TSV) landing part in the trench, the TSV landing part having:
      a first portion spaced apart from the first surface of the substrate, and
      a second portion between the first portion and the first surface of the substrate, the first portion being wider than the second portion;
   a TSV hole in the substrate, the TSV hole extending from the second surface of the substrate and aligned with a bottom surface of the TSV landing part; and
   a TSV in the TSV hole and in contact with the bottom surface of the TSV landing part wherein a width of the TSV increases and does not decrease in a direction from the first surface to the second surface.

2. The integrated circuit semiconductor device as claimed in claim 1, wherein the first surface is a front surface of the substrate, and the second surface is a rear surface of the substrate.

3. The integrated circuit semiconductor device as claimed in claim 1, wherein:
   the trench includes upper and lower trenches in communication with each other,
   the second portion of the TSV landing part is an upper TSV landing part buried in the upper trench adjacent to the first surface of the substrate, and
   the first portion of the TSV landing part is a lower TSV landing part buried in the lower trench, the lower trench being between the upper trench and the second surface of the substrate.

4. The integrated circuit semiconductor device as claimed in claim 3, wherein a width of at least a portion of the lower TSV landing part is greater than a width of a portion of the upper TSV landing part.

5. The integrated circuit semiconductor device as claimed in claim 3, wherein a cross-sectional shape of the lower TSV landing part is one of a circular shape, a semicircular shape, and a polygonal shape.

6. The integrated circuit semiconductor device as claimed in claim 1, wherein the trench has a first depth from the first surface, the TSV hole has a second depth from the second surface, and the second depth is greater than the first depth.

7. The integrated circuit semiconductor device as claimed in claim 1, wherein the TSV landing part includes a first TSV landing part and a second TSV landing part spaced apart from each other, a cross-sectional shape of the first TSV landing part being different from a cross-sectional shape of the second TSV landing part.

8. The integrated circuit semiconductor device as claimed in claim 1, wherein a width of a first portion of the TSV adjacent to the second surface is greater than a width of a second portion of the TSV adjacent to the TSV landing part.

9. The integrated circuit semiconductor device as claimed in claim 1, further comprising a trench liner layer and a via hole liner layer on inner sidewalls of the trench and the TSV hole, respectively.

10. An integrated circuit semiconductor device, comprising:
    a substrate including a first surface and a second surface opposite the first surface;
    active elements on the first surface of the substrate;
    through silicon via (TSV) landing parts connected to the active elements, the TSV landing parts being buried in respective trenches within the substrate, and each of the TSV landing parts having:
       a first portion spaced apart from the first surface of the substrate, and
       a second portion between the first portion and the first surface of the substrate, the first portion being wider than the second portion;
    TSV holes in the substrate, the TSV holes extending from the second surface of the substrate and being aligned with bottom surface of the TSV landing parts; and
    TSVs connected to the TSV landing parts, respectively, the TSVs being buried in the TSV holes, respectively, wherein some of the TSV landing parts are connected to a power rail part or a ground rail part, wherein a width of each TSV of the TSVs increases and does not decrease in a direction from the first surface to the second surface.

11. The integrated circuit semiconductor device as claimed in claim 10, wherein:
    each of the respective trenches includes an upper trench extending to a certain depth from the first surface and a lower trench extending from the upper trench toward the second surface, and
    the TSV landing parts are buried in the upper and lower trenches.

12. The integrated circuit semiconductor device as claimed in claim 10, further comprising a local wiring layer on the first surface of the substrate, the local wiring layer including a local wiring connected to the TSV landing parts, and the TSV landing parts being connected to source and drain regions of the active elements through the local wiring.

13. The integrated circuit semiconductor device as claimed in claim 12, further comprising an upper multilayer wiring layer on the local wiring layer.

14. The integrated circuit semiconductor device as claimed in claim 10, further comprising:
    a lower multilayer wiring layer on the second surface of the substrate; and a power and ground terminal on the lower multilayer wiring layer and connected to the TSV landing parts, the power and ground terminal being connected to the power rail part or the ground rail part via the lower multilayer wiring layer and the TSVs.

15. The integrated circuit semiconductor device as claimed in claim 10, further comprising:
   a lower multilayer wiring layer on the second surface of the substrate; and
   a signal input/output (I/O) terminal on the lower multilayer wiring layer and connected to the TSV landing parts, the signal input/output (I/O) terminal being connected to the power rail part or the ground rail part via the lower multilayer wiring layer and the TSVs.

16. The integrated circuit semiconductor device as claimed in claim 10, further comprising:
   an upper multilayer wiring layer on the first surface of the substrate;
   a lower multilayer wiring layer on the second surface of the substrate;
   an additional TSV in the substrate; and
   a signal input/output (I/O) terminal on the lower multilayer wiring layer and connected to the active elements through the upper multilayer wiring layer via the lower multilayer wiring layer and the additional TSV.

17. An integrated circuit semiconductor device, comprising:
   a substrate including a first surface and a second surface opposite the first surface;
   active elements on the first surface of the substrate, the active elements including:
      finFET transistors with pins on the first surface of the substrate, the pins extending in a first direction,
      gate electrodes extending in a second direction vertical to the first direction, and
      source and drain regions at opposite sides of each of the gate electrodes;
   through silicon via (TSV) landing parts connected to the source drain regions of the finFET transistors and buried in the substrate, each of the TSV landing parts having:
      a first portion spaced apart from the first surface of the substrate, and
      a second portion between the first portion and the first surface of the substrate, the first portion being wider than the second portion; and
   TSVs connected to the TSV landing parts and buried in TSV holes aligned with bottom surfaces of the TSV landing parts from the second surface,
   wherein a width of each TSV of the TSVs increases and does not decrease in a direction from the first surface to the second surface,
   wherein some of the TSV landing parts are connected to a power rail part or a ground rail part in a same direction as the first direction.

18. The integrated circuit semiconductor device as claimed in claim 17, further comprising a signal input/output (I/O) terminal electrically connected to some of the TSV landing parts.

19. The integrated circuit semiconductor device as claimed in claim 17, wherein:
   the first surface is a front surface of the substrate,
   the second surface is a rear surface of the substrate,
   a preliminary substrate is further attached on the first surface, and
   a power and ground terminal connected to a lower multilayer wiring layer is further positioned on the second surface.

20. The integrated circuit semiconductor device as claimed in claim 17, wherein each of the TSV landing parts has a certain depth from the first surface, and a cross-sectional shape of each of the TSV landing parts is one of a circular shape, a semicircular shape, and a polygonal shape.

* * * * *